United States Patent
Moffatt et al.

(10) Patent No.: US 9,498,845 B2
(45) Date of Patent: *Nov. 22, 2016

(54) PULSE TRAIN ANNEALING METHOD AND APPARATUS

(71) Applicant: Applied Materials, Inc., Santa Clara, CA (US)

(72) Inventors: Stephen Moffatt, St. Brelade (JE); Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 64 days.

This patent is subject to a terminal disclaimer.

(21) Appl. No.: 13/707,476

(22) Filed: Dec. 6, 2012

(65) Prior Publication Data

US 2014/0158674 A1 Jun. 12, 2014
US 2016/0023302 A9 Jan. 28, 2016

Related U.S. Application Data

(63) Continuation of application No. 12/853,155, filed on Aug. 9, 2010, now abandoned, which is a continuation
(Continued)

(51) Int. Cl.
*H01L 21/26* (2006.01)
*F27B 5/14* (2006.01)
(Continued)

(52) U.S. Cl.
CPC ....... *B23K 26/0622* (2015.10); *B23K 26/0006* (2013.01); *B23K 26/0081* (2013.01);
(Continued)

(58) Field of Classification Search
None
See application file for complete search history.

(56) References Cited

U.S. PATENT DOCUMENTS 4,151,008 A * 4/1979 Kirkpatrick .................. 438/799
4,370,175 A 1/1983 Levatter
(Continued)

FOREIGN PATENT DOCUMENTS

CN 1267906 A 9/2000
CN 1365513 A 8/2002
(Continued)

OTHER PUBLICATIONS

Takamatsu et al, Preprints of the 1991 Spring Meeting of the Japan Society of Applied Physics, "Evaluation of Anneal Effect by Photoacoustic Displacement Measurement," Abstract, Spring 1991.*
(Continued)

*Primary Examiner* — Joseph M Pelham
(74) *Attorney, Agent, or Firm* — Patterson & Sheridan, LLP

(57) ABSTRACT

The present invention generally describes apparatuses and methods used to perform an annealing process on desired regions of a substrate. In one embodiment, pulses of electromagnetic energy are delivered to a substrate using a flash lamp or laser apparatus. The pulses may be from about 1 nsec to about 10 msec long, and each pulse has less energy than that required to melt the substrate material. The interval between pulses is generally long enough to allow the energy imparted by each pulse to dissipate completely. Thus, each pulse completes a micro-anneal cycle. The pulses may be delivered to the entire substrate at once, or to portions of the substrate at a time. Further embodiments provide an apparatus for powering a radiation assembly, and apparatuses for detecting the effect of pulses on a substrate.

5 Claims, 14 Drawing Sheets

Related U.S. Application Data of application No. 12/173,967, filed on Jul. 16, 2008, now Pat. No. 7,800,081.

(60) Provisional application No. 60/986,550, filed on Nov. 8, 2007.

(51) Int. Cl.

| | | |
|---|---|---|
| *F27B 5/18* | (2006.01) | |
| *F27D 21/00* | (2006.01) | |
| *H01L 21/268* | (2006.01) | |
| *B23K 26/00* | (2014.01) | |
| *B23K 26/08* | (2014.01) | |
| *B23K 26/12* | (2014.01) | |
| *F27D 19/00* | (2006.01) | |

(52) U.S. Cl.
CPC ......... *B23K 26/0853* (2013.01); *B23K 26/123* (2013.01); *B23K 26/126* (2013.01); *F27B 5/18* (2013.01); *H01L 21/268* (2013.01); *B23K 2203/56* (2015.10); *F27B 5/14* (2013.01); *F27D 21/0014* (2013.01); *F27D 2019/0003* (2013.01)

(56) References Cited

U.S. PATENT DOCUMENTS

| | | | | |
|---|---|---|---|---|
| 4,476,150 A * | 10/1984 | Rose | | 427/10 |
| 4,504,727 A * | 3/1985 | Melcher | | B23K 26/03 |
| | | | | 219/121.62 |
| 4,543,486 A * | 9/1985 | Rose | | 250/492.1 |
| 4,707,217 A | 11/1987 | Aklufi | | |
| 5,194,723 A * | 3/1993 | Cates | | G01N 29/2418 |
| | | | | 219/121.62 |
| 5,424,244 A | 6/1995 | Zhang et al. | | |
| 5,529,951 A | 6/1996 | Noguchi et al. | | |
| 5,756,364 A | 5/1998 | Tanaka et al. | | |
| 6,326,219 B2 | 12/2001 | Markle et al. | | |
| 6,376,806 B2 * | 4/2002 | Yoo | | 219/411 |
| 6,835,914 B2 | 12/2004 | Timans | | |
| 6,849,831 B2 | 2/2005 | Timans et al. | | |
| 6,908,835 B2 | 6/2005 | Sposili et al. | | |
| 6,951,996 B2 | 10/2005 | Timans et al. | | |
| 7,078,302 B2 | 7/2006 | Ma et al. | | |
| 7,084,068 B2 * | 8/2006 | Suguro et al. | | 438/708 |
| 7,109,443 B2 | 9/2006 | Knutson et al. | | |
| 7,135,423 B2 | 11/2006 | Downey | | |
| 7,135,656 B2 | 11/2006 | Timans | | |
| 7,163,899 B1 | 1/2007 | Cho et al. | | |
| 7,183,229 B2 | 2/2007 | Yamanaka | | |
| 7,274,281 B2 | 9/2007 | Sugioka et al. | | |
| 7,276,457 B2 | 10/2007 | Yoo | | |
| 7,364,952 B2 * | 4/2008 | Im | | B23K 26/0604 |
| | | | | 219/121.6 |
| 7,491,972 B1 | 2/2009 | Kimura et al. | | |
| 7,582,848 B2 * | 9/2009 | Smart | | 219/121.69 |
| 7,800,081 B2 * | 9/2010 | Moffatt et al. | | 250/492.2 |
| 8,050,546 B2 | 11/2011 | Kusuda | | |
| 8,518,838 B2 * | 8/2013 | Carey et al. | | 438/795 |
| 2002/0111043 A1 | 8/2002 | Mahawili | | |
| 2002/0195437 A1 | 12/2002 | Kusuda | | |
| 2003/0068836 A1 * | 4/2003 | Hongo et al. | | 438/30 |
| 2003/0183612 A1 * | 10/2003 | Timans et al. | | 219/390 |
| 2004/0053450 A1 | 3/2004 | Sposili et al. | | |
| 2004/0108519 A1 | 6/2004 | Itani | | |
| 2004/0149715 A1 * | 8/2004 | Timans et al. | | 219/390 |
| 2005/0059265 A1 | 3/2005 | Im | | |
| 2005/0074985 A1 | 4/2005 | Yoo | | |
| 2005/0170572 A1 | 8/2005 | Hongo et al. | | |
| 2005/0282406 A1 * | 12/2005 | Bruland et al. | | 438/795 |
| 2005/0282407 A1 * | 12/2005 | Bruland et al. | | 438/795 |
| 2006/0018639 A1 | 1/2006 | Ramamurthy et al. | | |
| 2006/0030164 A1 * | 2/2006 | Im | | H01L 21/2026 |
| | | | | 438/795 |
| 2006/0081596 A1 | 4/2006 | Kusuda et al. | | |
| 2007/0041410 A1 | 2/2007 | Hongo et al. | | |
| 2007/0079750 A1 * | 4/2007 | Miguez et al. | | 117/68 |
| 2007/0212859 A1 * | 9/2007 | Carey et al. | | 438/487 |
| 2007/0218644 A1 | 9/2007 | Balakrishna et al. | | |
| 2007/0221640 A1 | 9/2007 | Jennings et al. | | |
| 2008/0017114 A1 | 1/2008 | Watanabe et al. | | |
| 2008/0037964 A1 | 2/2008 | Kobayashi et al. | | |
| 2008/0069550 A1 * | 3/2008 | Timans et al. | | 392/411 |
| 2008/0101780 A1 | 5/2008 | Yokouchi et al. | | |
| 2008/0124816 A1 * | 5/2008 | Bruland et al. | | 438/6 |
| 2008/0181269 A1 * | 7/2008 | Osako et al. | | 372/30 |
| 2008/0273867 A1 * | 11/2008 | Camm et al. | | 392/416 |
| 2009/0010626 A1 | 1/2009 | Ramamurthy et al. | | |
| 2009/0011614 A1 * | 1/2009 | Bruland et al. | | 438/795 |
| 2009/0120924 A1 | 5/2009 | Moffatt et al. | | |
| 2009/0121157 A1 * | 5/2009 | Moffatt | | H01L 21/268 |
| | | | | 250/492.2 |
| 2010/0297856 A1 * | 11/2010 | Moffatt et al. | | 438/795 |
| 2010/0323532 A1 * | 12/2010 | Carey et al. | | 438/795 |
| 2012/0145684 A1 * | 6/2012 | Carey et al. | | 219/121.65 |
| 2012/0325784 A1 * | 12/2012 | Moffatt | | B23K 26/03 |
| | | | | 219/121.61 |
| 2013/0029499 A1 * | 1/2013 | Hunter | | H01L 21/02686 |
| | | | | 438/799 |
| 2014/0073145 A1 * | 3/2014 | Moffatt | | B23K 26/0626 |
| | | | | 438/795 |
| 2014/0256161 A1 * | 9/2014 | Li | | H01L 21/268 |
| | | | | 438/795 |
| 2015/0037984 A1 * | 2/2015 | Zhang | | B23K 26/0066 |
| | | | | 438/799 |
| 2016/0023302 A9 * | 1/2016 | Moffatt | | B23K 26/0081 |
| | | | | 219/385 |

FOREIGN PATENT DOCUMENTS

| | | | |
|---|---|---|---|
| CN | 1643323 A | 7/2005 | |
| CN | 1735961 A | 2/2006 | |
| EP | 0655774 | 5/1995 | |
| EP | 1667213 A1 | 6/2006 | |
| JP | S59-194430 | 11/1984 | |
| JP | H1-152718 A | 6/1989 | |
| JP | H7-124776 | 5/1995 | |
| JP | H8139047 | 5/1996 | |
| JP | 2000-277448 | 10/2000 | |
| JP | 2001044132 A | 2/2001 | |
| JP | 2001044132 A * | 2/2001 | ........... H01L 21/265 |
| JP | 2003-068644 A | 3/2003 | |
| JP | 2003-109912 | 4/2003 | |
| JP | 2003100652 A | 4/2003 | |
| JP | 2003-528462 A | 9/2003 | |
| JP | 2004-103841 | 4/2004 | |
| JP | 2004-151668 A | 5/2004 | |
| JP | 2004186495 A | 7/2004 | |
| JP | 2004-356513 A | 12/2004 | |
| JP | 2005-136218 | 5/2005 | |
| JP | 2005-217213 A | 8/2005 | |
| JP | 2007-059458 A | 3/2007 | |
| JP | 2009-188378 A | 8/2009 | |
| KR | 1996-8499 | 6/1996 | |
| KR | 2003-0066318 | 8/2003 | |
| KR | 1020050119132 | 12/2005 | |
| WO | WO-0118855 A1 | 3/2001 | |
| WO | 01/71781 A1 | 9/2001 | |
| WO | WO-02086954 A1 | 10/2002 | |

OTHER PUBLICATIONS

Japanese Office Action (with attached English translation) for Application No. 2012-034741; 9 total pages; Nov. 26, 2013.
USPTO Office Action for U.S. Appl. No. 13/774,741; 7 pages; Apr. 29, 2014.
Japanese Office Action (with attached English translation) for Application No. 2008-287019; 5 total pages; May 28, 2014.
Office Action for Chinese Application No. 200810175468.9 dated Jun. 24, 2011.

(56) References Cited

OTHER PUBLICATIONS

Office Action for Chinese Application No. 200810175468.9 dated May 17, 2012.
Office Action for Chinese Application No. 201110323788.6 dated Jul. 28, 2014.
Office Action for Japanese Application No. 2012-034741 dated Aug. 5, 2014.
Office Action for Korean Application No. 10-2008-0110934 dated Dec. 29, 2010.
Office Action for Korean Application No. 10-2008-0110934 dated Feb. 9, 2012.
Notice of Grant for Korean Application No. 10-2008-0110934 dated May 17, 2012.
Notice of Grant for Korean Application No. 2011-0065013 dated Jul. 29, 2014.
Notice of Grant for Korean Application No. 10-2011-0065017 dated Jul. 29, 2014.
Notice of Grant for Korean Application No. 10-2011-0065027 dated Jul. 29, 2014.
Notice of Grant for Korean Application No. 10-2011-0065030 dated Aug. 11, 2014.
Notice of Grant for Korean Application No. 10-2011-0065038 dated Aug. 11, 2014.
Notice of Grant and Search Report for Taiwanese Application No. 97143156 dated Dec. 3, 2013.
Office Action and Search Report for Taiwanese Application No. 100143417 dated Nov. 14, 2013.
Notice of Grant for Taiwanese Application No. 100143417 dated Nov. 11, 2013.
Office Action for U.S. Appl. No. 12/853,155 dated Feb. 15, 2012.
Final Office Action for U.S. Appl. No. 12/853,155 dated Sep. 7, 2012.
Final Office Action for Chinese Application No. 200810175468.9 dated Dec. 21, 2012.
Japanese Office Action (with English translation) for Application No. 2008-287019 dated Jun. 4, 2013; 5 total pages.
First Office Action issued Dec. 4, 2009 in Chinese Application No. 2008101754689.
Extended European Search Report mailed Nov. 19, 2009 in EP 08168782.4.

P. H. Liang, et al.; Ultrashort Laser-Pulse Annealing of Hydrogenated Amorphous Silicon; Appl. Phys. A 26, pp. 39-43 (1981).
Sanjay Bhardwaj, et al.; Process Monitoring Techniques Using Acoustic Waves; IEEE 1990 Ultrasonics Symposium, pp. 367-369 (1990).
Sanjay Bhardwaj, et al.; In-Situ Film Thickness and Temperature Monitoring Using a 2 GHz Acoustic Phase Measurement System; IEEE 1991 Ultrasonics Symposium, pp. 965-967 (1991).
S. B. Felch, et al.; Sub-Melt Laser Annealing followed by Low-Temperature RTP for Minimized Diffusion; IEEE, pp. 167-170 (2000).
USPTO Office Action for U.S. Appl. No. 12/173,967; dated Dec. 28, 2009; 5 pages.
USPTO Notice of Allowance and Fee(s) Due for U.S. Appl. No. 12/173,967; dated May 14, 2010; 4 pages.
Chinese Office Action (with attached English translation) for Application No. 201110323788.6; dated Dec. 4, 2013; 11 total pages.
Taiwan Office Action (with attached English translation) for Application No. 97143156; dated Dec. 9, 2013; 6 total pages.
Korean Office Action (with attached English translation) for Application No. 10-2011-0065017; dated Jan. 23, 2014; 8 total pages.
Korean Office Action (with attached English translation) for Application No. 10-2011-0065013; dated Jan. 27, 2014; 8 total pages.
Korean Office Action (with attached English Translation) for Application No. 10-2011-65027; dated Jan. 27, 2014; 8 total pages.
USPTO Office Action for U.S. Appl. No. 13/774,741; dated Jan. 27, 2014; 7 pages.
Korean Office Action (with attached English translation) for Application No. 10-2011-65030; dated Jan. 28, 2014; 8 total pages.
Korean Office Action (with attached English translation) for Application No. 10-2011-0065038; dated Feb. 3, 2014; 10 total pages.
Chinese Office Action (with attached English translation) for Application No. 201110323788.6 dated Feb. 6, 2015; 20 total pages.
Office Action for Chinese Application No. 201110323788.6 dated Feb. 22, 2016.
Office Action for Japanese Application No. 2012-034741 dated Jan. 26, 2016.
Office Action for Chinese Application No. 201310092420.2 dated Mar. 16, 2015.
Office Action for Chinese Application No. 201310092420.2 dated May 12, 2016.

\* cited by examiner

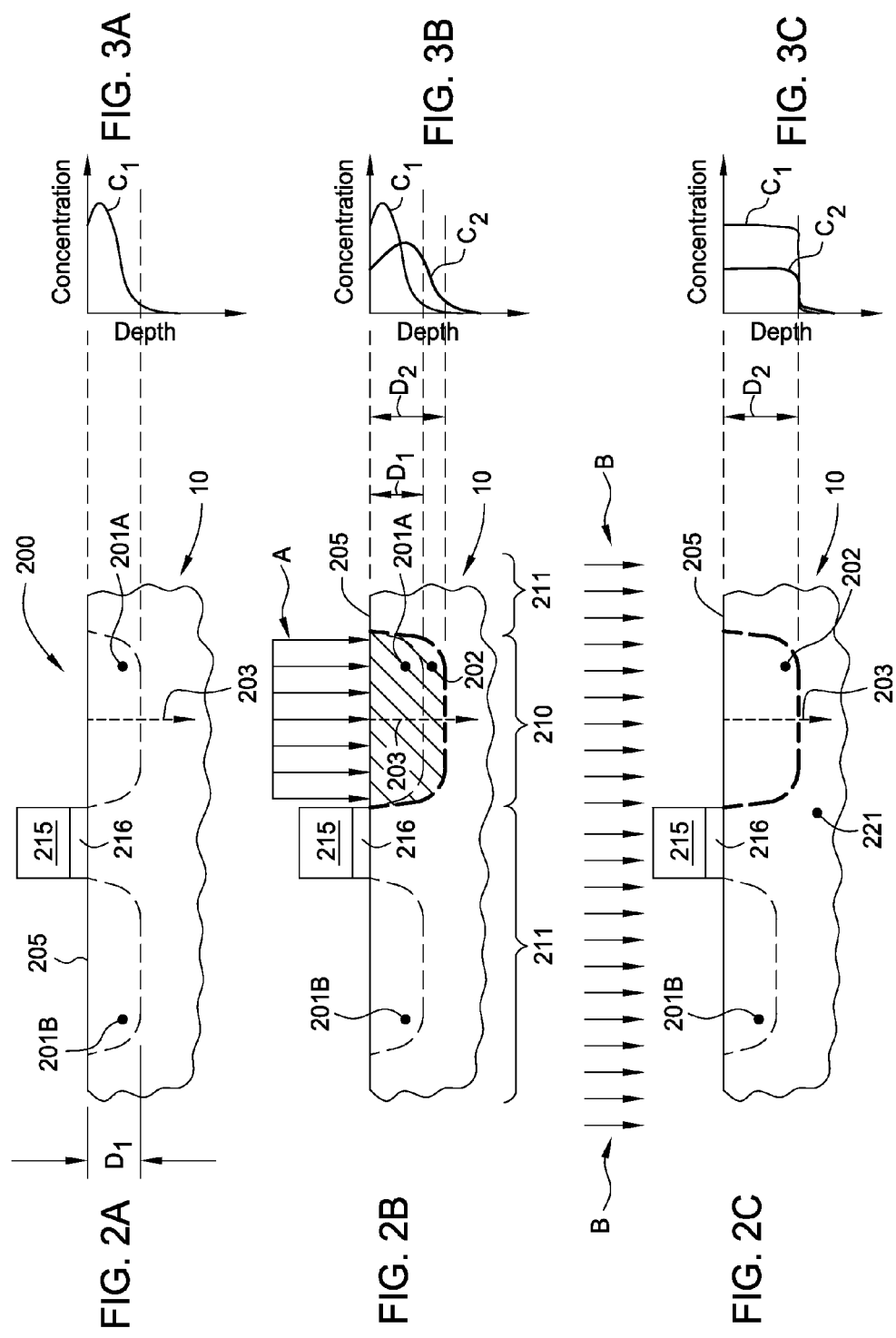

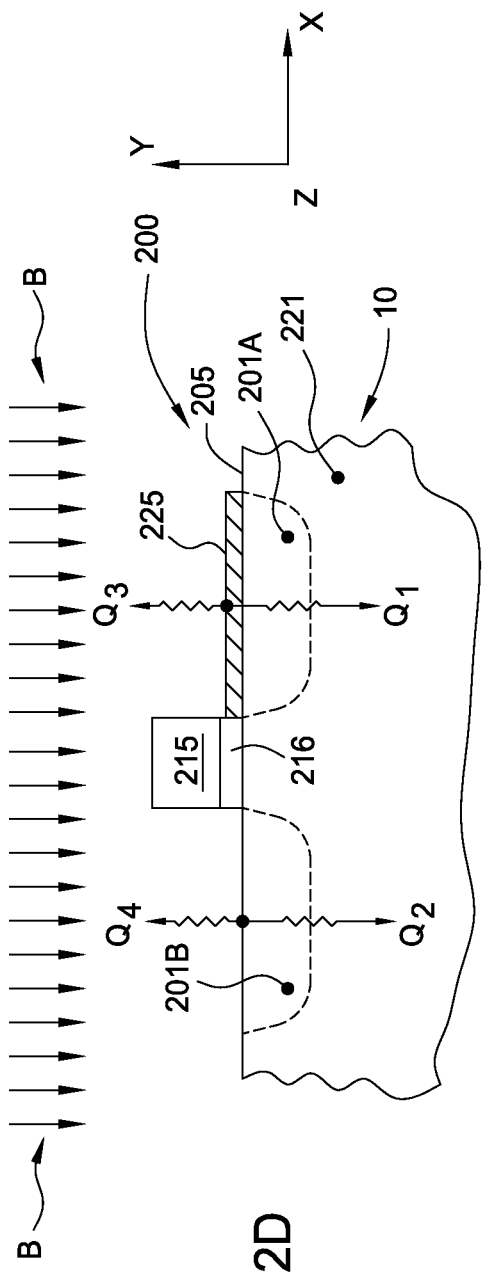

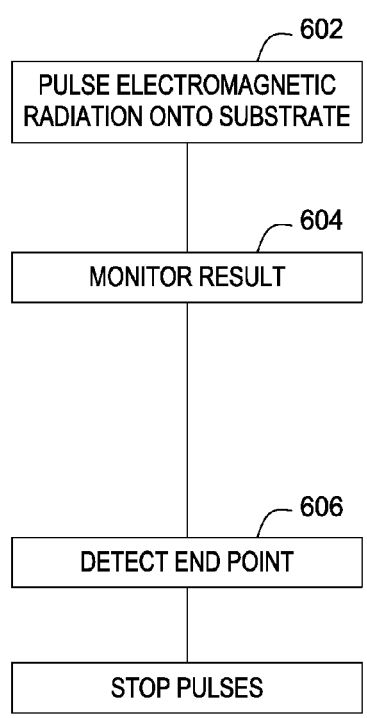
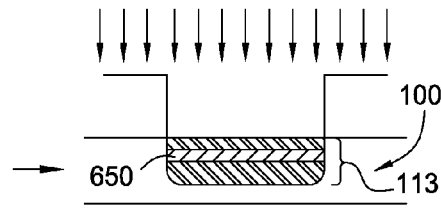
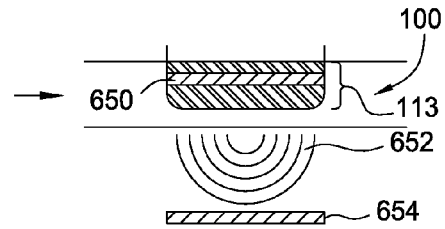
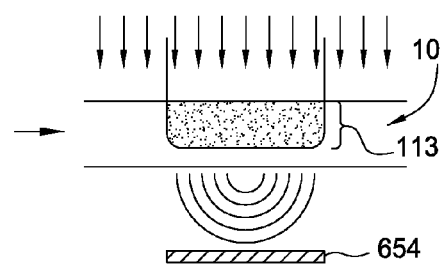
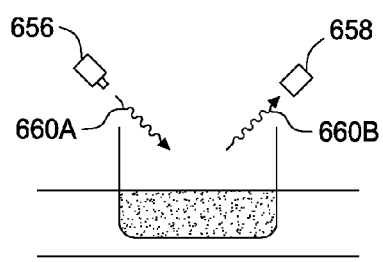
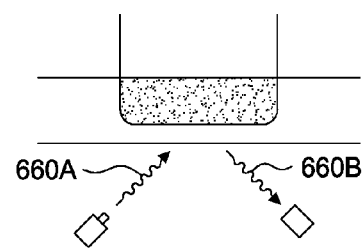

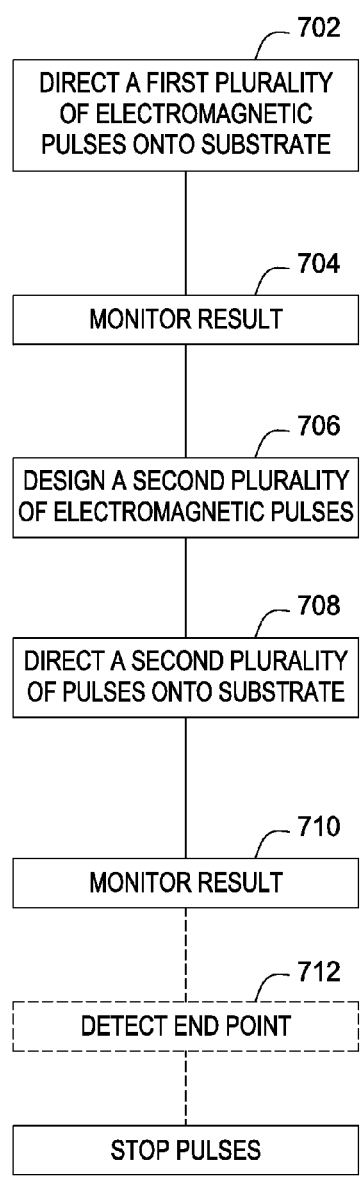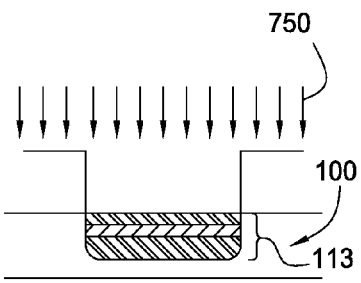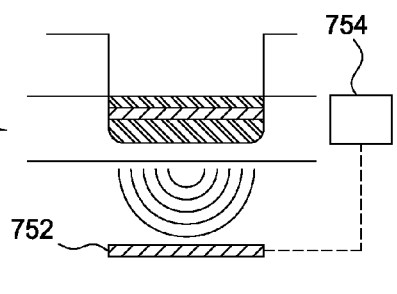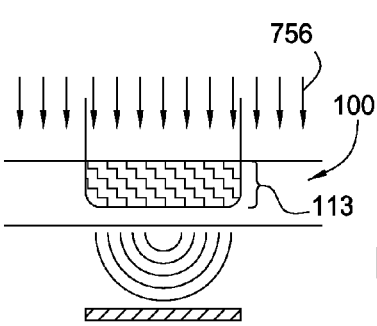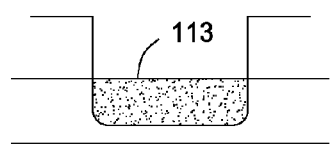

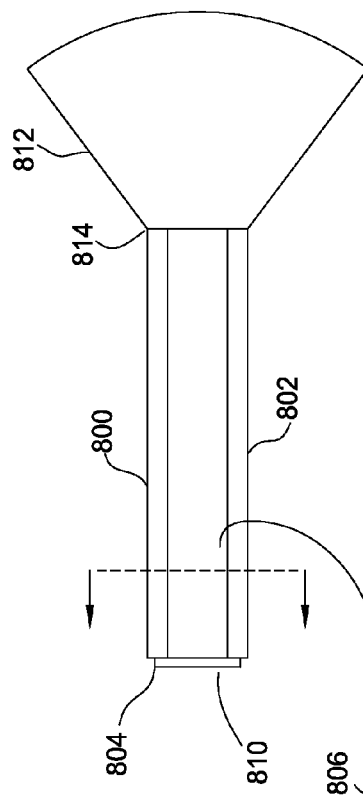
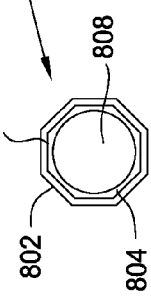
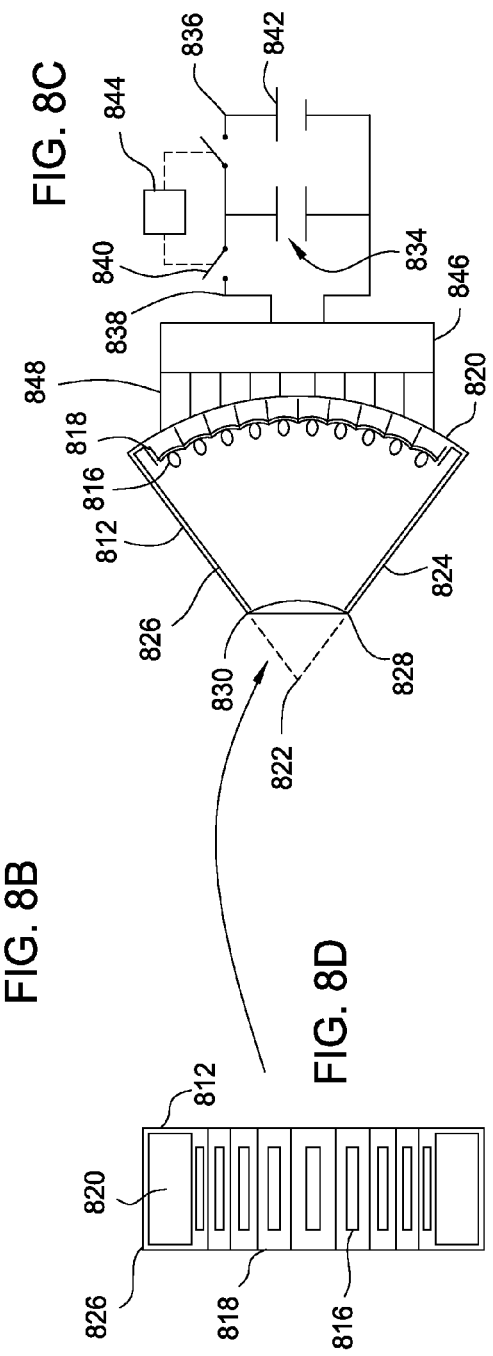

PULSE TRAIN ANNEALING METHOD AND APPARATUS

CROSS-REFERENCE TO RELATED APPLICATIONS

This application claims benefit of U.S. patent application Ser. No. 12/853,155, filed Aug. 9, 2010, which is a continuation of U.S. patent application Ser. No. 12/173,967, filed Jul. 16, 2008, now U.S. Pat. No. 7,800,081, which claims benefit of U.S. Provisional Patent Application Ser. No. 60/968,550, filed Nov. 8, 2007, each of which is herein incorporated by reference.

BACKGROUND OF THE INVENTION

1. Field of the Invention

Embodiments of the present invention generally relate to a method of manufacturing a semiconductor device. More particularly, the invention is directed to a method of thermally processing a substrate.

2. Description of the Related Art

The market for semiconductor devices continues to follow the path of Moore's Law. Current device geometry of 45 nanometers (nm) is projected to shrink to 20 nm and beyond to meet future performance requirements. For such scaling to be realized, engineering of doped source and drain junctions must focus on placement and movement of single atoms within a very small crystal lattice. For example, some future device designs contemplate channel regions comprising fewer than 100 atoms. With such exacting requirements, controlling placement of dopant atoms to within a few atomic radii is needed.

Placement of dopant atoms is controlled currently by processes of implanting dopants into source and drain regions of silicon substrates and then annealing the substrates. Dopants may be used to enhance electrical conductivity in a silicon matrix, to induce damage to a crystal structure, or to control diffusion between layers. Atoms such as boron (B), phosphorus (P), arsenic (As), cobalt (Co), indium (In), and antimony (Sb) may be used for enhanced conductivity. Silicon (Si), germanium (Ge), and argon (Ar) may be used to induce crystal damage. For diffusion control, carbon (C), fluorine (F), and nitrogen (N) are commonly used. During annealing, a substrate is typically heated to high temperatures so that various chemical and physical reactions can take place in multiple IC devices defined in the substrate. Annealing recreates a more crystalline structure from regions of the substrate that were previously made amorphous, and "activates" dopants by incorporating their atoms into the crystalline lattice of the substrate. Ordering the crystal lattice and activating dopants reduces resistivity of the doped regions. Thermal processes, such as annealing, involve directing a relatively large amount of thermal energy onto a substrate in a short amount of time, and thereafter rapidly cooling the substrate to terminate the thermal process. Examples of thermal processes that have been widely used for some time include Rapid Thermal Processing (RTP) and impulse (spike) annealing. Although widely used, such processes are not ideal because they ramp the temperature of the wafer too slowly and expose the wafer to elevated temperatures for too long. These problems become more severe with increasing wafer sizes, increasing switching speeds, and/or decreasing feature sizes.

In general, conventional thermal processes heat the substrates under controlled conditions according to a predetermined thermal recipe. These thermal recipes fundamentally consist of a target temperature for the semiconductor substrate, the rate of change of temperature, i.e., the temperature ramp-up and ramp-down rates, and the time that the thermal processing system remains at a particular temperature. For example, thermal recipes may require the substrate to be heated from room temperature to a peak temperature of 1200° C. or more, and may require processing times near each peak temperature ranging up to 60 seconds, or more.

The objective of all processes for annealing doped substrates is to generate enough movement of atoms within the substrate to cause dopant atoms to occupy crystal lattice positions, and to cause silicon atoms to reorder themselves into a crystalline pattern, without allowing dopant atoms to diffuse broadly through the substrate. Such broad diffusion reduces the electrical performance of the doped regions by reducing concentration of dopants and spreading them through a larger region of the substrate. To accomplish these objectives, the temperature ramp rates, both up and down, are preferably high. In other words, it is desirable to be able to adjust the temperature of the substrate from a low to a high temperature, or visa versa, in as short a time as possible. Current anneal processes are generally able to preserve concentration abruptness of about 3-4 nm/decade (10% change) of concentration. As junction depth shrinks to less than 100 Angstroms, however, future abruptness less than 2 nm/decade is of interest.

The need for high temperature ramp rates led to the development of Rapid Thermal Processing (RTP), where typical temperature ramp-up rates range from 200 to 400° C./s, as compared to 5-15° C./minute for conventional furnaces. Typical ramp-down rates are in the range of 80-150° C./s. Although the IC devices reside only in the top few microns of the substrate, RTP heats the entire substrate. This limits how fast one can heat and cool the substrate. Moreover, once the entire substrate is at an elevated temperature, heat can only dissipate into the surrounding space or structures. As a result, today's state of the art RTP systems struggle to achieve a 400° C./s ramp-up rate and a 150° C./s ramp-down rate.

Impulse and spike annealing have been utilized to accelerate temperature ramping further. Energy is delivered to one portion of the substrate over a very short time in a single impulse. In order to deliver enough energy to result in substantial annealing, however, large energy densities are required. For example, impulse annealing may require energy density delivered to the substrate above about 2 J/cm$^2$. Delivering enough energy to substantially anneal the substrate in a single short-duration pulse often results in significant damage to its surface. Moreover, delivering very short impulses of energy to the substrate can lead to problems of uniformity. Further, the energy needed to activate dopants may be very different from the energy needed to order the crystal lattice. Finally, shrinking device dimensions leads to over-diffusion of dopants beyond the junction region with even impulse and spike anneals.

Some have tried annealing a substrate using two or more pulses of energy, wherein a first pulse of energy may be designed to approximate the energy needed to activate dopants, and subsequent pulses individually adjusted in either intensity or duration to achieve a target thermal history of the substrate with the objective of ordering the crystal lattice. Such efforts have reported only limited success. It is thought that pulses delivering different amounts of energy, while promoting organization of the crystal lattice, may work to undo dopant activation accomplished in the first impulse. The differing modes of energy delivered by the impulses may excite different modes of movement within the crystal lattice that may generally remove crystal defects while dislodging some dopant atoms from their activated positions. Uniformity of treatment is also difficult to achieve.

To resolve some of the problems raised in conventional RTP-type processes various scanning laser anneal techniques have been used to anneal the surface(s) of the substrate. In general, these techniques deliver a constant energy flux to a small region on the surface of the substrate while the substrate is translated, or scanned, relative to the energy delivered to the small region. Even delivering constant energy flux to each region, uniform processing is difficult to achieve because the anneal regions have differing thermal histories. Regions treated first have thermal history comprising a sharp spike followed by long heat-soak, regions treated last have long heat-soak followed by sharp spike, and those in the middle have heat-soak/spike/heat-soak histories. Due to the stringent uniformity requirements and the complexity of minimizing the overlap of scanned regions across the substrate surface these types of processes are not effective for thermal processing of next-generation contact level devices formed on the surface of the substrate.

Moreover, as the size of the various elements in semiconductor devices decreases with the need to increase device speed, the normal conventional annealing techniques that allow rapid heating and cooling are not effective. In a future generation device with a channel region comprising 60 atoms, traditional notions of temperature and thermal gradients, generally based on statistical treatments of molecular translational energy in a material body, do not apply because of the gradation in the area in which the energy is to be transferred. Traditional RTP and laser anneal processes raise the substrate temperature to between about 1150-1350° C. for only about one second to remove damage in the substrate and achieve a desired dopant distribution. In one process step, these conventional methods seek to heat the substrate to a relatively high temperature and then rapidly cool it in a relatively short period of time. To ensure that a desired dopant distribution remains within the these small device regions one would need to devise a way to heat and cool the substrate rapidly between a peak anneal temperature, which is typically between about 1150-1200° C. for RTP processes, and a temperature that prevents continuing diffusion of the dopant atoms (e.g., <750° C.) in less than about 0.02 to about 1 second. Heating and cooling the substrate at these high rates is generally impossible with standard thermal treatment processes because a substrate will generally take about 0.5 seconds to cool down on its own. To induce more rapid cooling, it is necessary to apply a cooling medium, which in turn requires massive amounts of energy to heat the substrate to the target temperature. Even without the cooling medium, the energy required to maintain the temperature of a substrate at a high level using conventional techniques is formidable. Treating only portions of a substrate at one time reduces the energy budget, but generates stresses in the substrate that makes it break.

In view of the above, there is a need for a method of annealing a semiconductor substrate that has sufficient energy delivery control to allow the anneal of small devices, and an apparatus capable of performing that method. This will achieve the necessary control over the fabrication of smaller devices that will lead to increased performance.

SUMMARY OF THE INVENTION

The present invention generally provides an apparatus and method for pulsed annealing of a substrate. More specifically, embodiments of the invention provide an apparatus for treating a substrate, comprising a body portion, a substrate support coupled to the body portion, a plurality of sources of electromagnetic radiation disposed in a radiation assembly, the radiation assembly coupled to the body portion, one or more power supplies coupled to the radiation assembly, a controller coupled to the power supply, and a detector configured to detect an acoustic emission from the substrate.

Other embodiments of the invention provide a method of annealing a substrate, comprising disposing the substrate on a substrate support, directing at least 100 pulses of electromagnetic energy toward the substrate, and detecting sound waves generated by the substrate when each pulse of electromagnetic energy strikes the substrate.

Other embodiments of the invention provide a process of annealing a substrate, comprising positioning the substrate on a substrate support in a processing chamber, and delivering a plurality of electromagnetic energy pulses to a surface of the substrate, wherein each of the plurality of electromagnetic pulses have a total energy and a pulse duration, and wherein the total energy of each of the plurality of electromagnetic pulses delivered over the pulse duration is not enough to heat a material disposed on or disposed within the substrate surface to a temperature above its melting point.

Embodiments of the invention further provide a method of processing a substrate having a front side and a back side, comprising positioning the substrate on a substrate support in a processing chamber, controlling the temperature of the substrate support at a temperature below the melting temperature of the substrate, delivering a first pulse of electromagnetic energy to a first surface of the substrate, wherein the first pulse of electromagnetic energy has a first total energy and a first duration, detecting an amount of energy reaching a second surface of the substrate in response to the first pulse of electromagnetic energy striking the first surface of the substrate, selecting a second desired total energy and second duration for a second electromagnetic energy pulse based on detecting the amount of energy reaching a second surface, and delivering the second pulse of electromagnetic energy to the first surface of the substrate.

Embodiments of the invention further provide a method of annealing a substrate in a processing chamber, comprising positioning the substrate on a substrate support, controlling the temperature of the substrate support at a temperature below the melting temperature of the substrate, directing a first plurality of electromagnetic energy pulses, each having a duration between about 1 nanosecond (nsec) and about 10 milliseconds (msec) and an energy density less than that required to melt the substrate material, at a first surface of the substrate, detecting an amount of energy reaching a second surface of the substrate in response to each of the first plurality of electromagnetic energy pulses striking the first surface of the substrate, selecting a power level for subsequent electromagnetic energy pulses based on the amount of energy reaching a second surface of the substrate, directing a second plurality of electromagnetic energy pulses at the selected power level, each having a duration of about 20 nsec to about 10 msec, to a first portion of the substrate, directing a third plurality of electromagnetic energy pulses at the selected power level, each having a duration of about 20 nsec to about 10 msec, to a second portion of the substrate, and detecting an end point by monitoring a second acoustic response from the substrate.

Embodiments of the invention further provide an apparatus for processing a substrate comprising a substrate holder coupled to a first end of a body portion and a radiation assembly coupled to a second end of the body portion. The substrate holder is configured to hold a substrate in substantial radial alignment with the body portion, and to control bulk temperature of the substrate. The body portion may be faceted or rounded, and is coated inside with a reflective liner. The body portion may contain internal structures, such as reflectors and refractors, to control and direct electromagnetic energy. The radiation assembly is coupled to the second end of the body portion using a lens to direct electromagnetic energy from the radiation assembly into the body portion. The radiation assembly has a curved portion opposite the lens configured to house a plurality of flash lamps, each disposed within a trough reflector. The radiation assembly may be internally lined with a reflective liner.

Embodiments of the invention further provide another apparatus for processing a substrate comprising a substrate holder coupled to a first end of a body portion, and a body portion may be faceted or rounded, and is coated inside with a reflective liner. The body portion may contain internal structures, such as reflectors and refractors, to control and direct electromagnetic energy. The flash lamps may be disposed to cross the radiance region and pierce one or more sides of the radiance region. A reflective backing plate is sealably disposed against the radiance region of the body portion.

Embodiments of the invention further provide an apparatus and method of controlling a flash lamp apparatus, comprising a power supply, a charging circuit, a firing circuit, a switch in each of the charging and firing circuits to open and close the circuits independently, one or more capacitors configured for charging through the charging circuit and discharging through the firing circuit, a controller to control operation of the switches, a power distribution device for equalizing power delivered to the flash lamps, and individual firing leads coupled to the power distribution device and to each flash lamp. A controller may also control charging by varying output of the power supply. Additionally, elements such as resistors and inductors may be included in the firing circuit to adjust the profile of power transmitted to the flash lamps.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2E are cross-sectional views of a device according to one embodiment of the invention.

FIGS. 3A-3C are graphs of dopant and crystal defect concentration versus depth according to an embodiment of the invention.

FIG. 6A is a flowchart according to an embodiment of the invention.

FIGS. 6B-6D are cross-sectional diagrams of a substrate, schematically showing its condition at stages of the process shown in FIG. 6A, according to an embodiment of the invention.

FIGS. 6E-6F show an apparatus configured according to embodiments of the invention.

FIG. 7A is a flowchart according to an embodiment of the invention.

FIGS. 7B-7E are cross-sectional diagrams of a substrate, schematically showing its condition at stages of the process shown in FIG. 7A, according to an embodiment of the invention.

FIGS. 8A-8F are diagrams of an apparatus according to an embodiment of the invention.

DETAILED DESCRIPTION

Figure 1A:
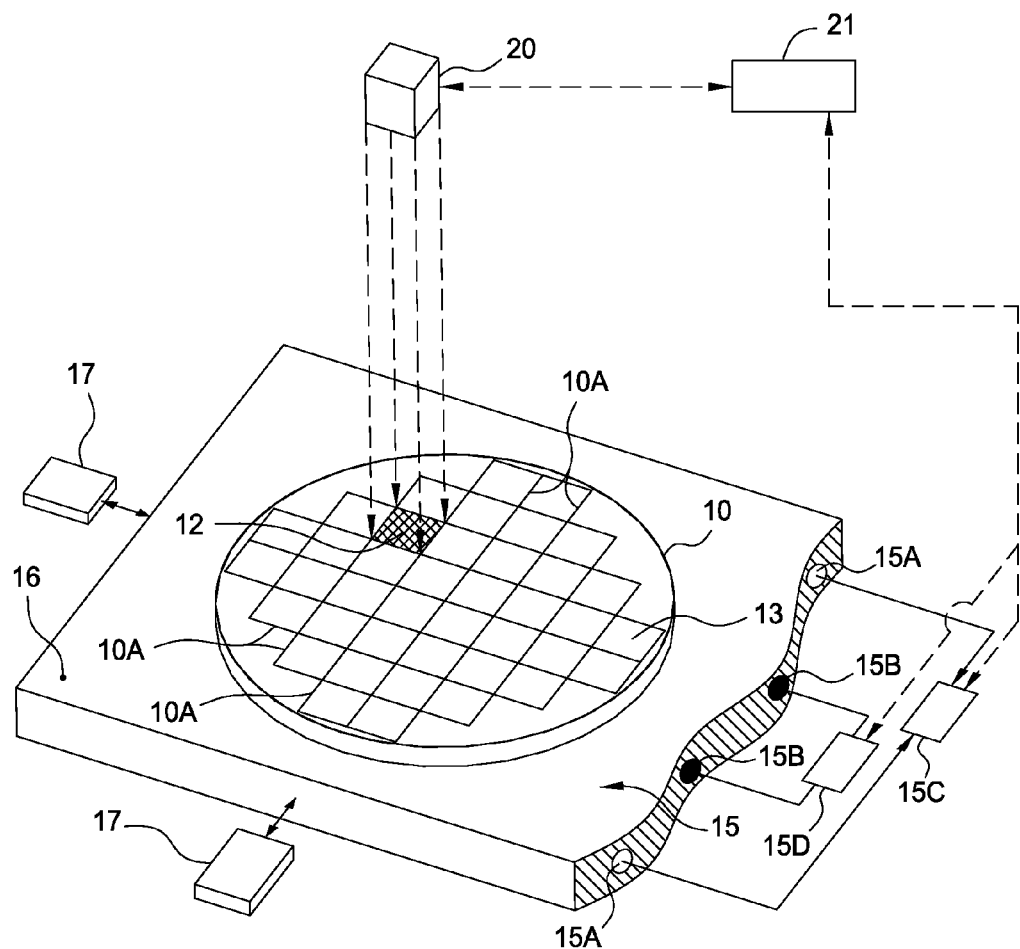
FIG. 1A is an isometric view illustrating one embodiment of the invention.

The present invention generally provides an apparatus and methods of controlling the energy delivered during an anneal process that is performed during the formation of one or more semiconductor devices on a substrate. Generally, the methods of the present invention may be used to anneal the whole substrate or selected regions of a substrate by delivering enough energy to the substrate surface to cause the damage induced during an implant process to be removed and to provide a desired dopant distribution within the surface of the substrate. The need to control the diffusion of dopants and removal of damage from the desired regions of the semiconductor device is becoming increasingly important as device sizes shrink. This is especially clear in the 45 nm nodes and smaller where the channel regions have dimensions on the order of 500 angstroms (Å) or less. The annealing process generally includes delivering enough energy in a series of sequential pulses of energy to allow for a controlled diffusion of dopants and the removal of damage from the substrate over a short distance within desired regions of a semiconductor device. In one example, the short distance is between about one lattice plane to tens of lattice planes. In one embodiment, the amount of energy delivered during a single pulse is only enough to provide an average diffusion depth that is only a portion of a single lattice plane and thus the annealing process requires multiple pulses to achieve a desired amount of dopant diffusion or lattice damage correction. Each pulse may thus be said to accomplish a complete micro-anneal process within a portion of the substrate. In one embodiment, the number of sequential pulses may vary between about 30 and about 100,000 pulses, each of which has a duration of about 1 nanosecond (nsec) to about 10 milliseconds (msec). In other embodiments, duration of each pulse may be less than 10 msec, such as between about about 1 msec and about 10 msec, or preferably between about 1 nsec and about 10 microseconds (μsec), more preferably less than about 100 nsec. In some embodiments, duration of each pulse may be between about 1 nsec and about 10 nsec, such as about 1 nsec.

Each micro-anneal process features heating a portion of the substrate to an anneal temperature for a duration, and then allowing the anneal energy to dissipate completely within the substrate. The energy imparted excites motion of atoms within the anneal region which is subsequently frozen after the energy dissipates. The region immediately beneath the anneal region is substantially pure ordered crystal. As energy from a pulse propagates through the substrate, interstitial atoms (dopant or silicon) closest to the ordered region are nudged into lattice positions. Other atoms not ordered into immediately adjacent lattice positions diffuse upward toward the disordered region and away from the ordered region to find the nearest available lattice positions to occupy. Additionally, dopant atoms diffuse from high concentration areas near the surface of the substrate to lower concentration areas deeper into the substrate. Each successive pulse grows the ordered region upward from the ordered region beneath the anneal region toward the surface of the substrate, and smoothes the dopant concentration profile. This process may be referred to an epitaxial crystal growth, because it proceeds layer by layer, with each pulse of energy accomplishing from a few to tens of lattice planes of annealing.

In general the term "substrates" as used herein refers to objects that can be formed from any material that has some natural electrical conducting ability or a material that can be modified to provide the ability to conduct electricity. Typical substrate materials include, but are not limited to, semiconductors, such as silicon (Si) and germanium (Ge), as well as other compounds that exhibit semiconducting properties. Such semiconductor compounds generally include group III-V and group II-VI compounds. Representative group III-V semiconductor compounds include, but are not limited to, gallium arsenide (GaAs), gallium phosphide (GaP), and gallium nitride (GaN). Generally, the term "semiconductor substrates" includes bulk semiconductor substrates as well as substrates having deposited layers disposed thereon. To this end, the deposited layers in some semiconductor substrates processed by the methods of the present invention are formed by either homoepitaxial (e.g., silicon on silicon) or heteroepitaxial (e.g., GaAs on silicon) growth. For example, the methods of the present invention may be used with gallium arsenide and gallium nitride substrates formed by heteroepitaxial methods. Similarly, the invented methods can also be applied to form integrated devices, such as thin-film transistors (TFTs), on relatively thin crystalline silicon layers formed on insulating substrates (e.g., silicon-on-insulator [SOI] substrates). Additionally, the methods may be used to fabricate photovoltaic devices, such as solar cells. Such devices may comprise layers of conductive, semiconductive, or insulating materials, and may be patterned using a variety of material removal processes. Conductive materials generally comprise metals. Insulating materials may generally include oxides of metals or semiconductors, or doped semiconductor materials.

In one embodiment of the invention, sequential delivered amounts of energy are directed to the surface of the substrate to anneal certain desired regions of the substrate to remove unwanted damage created from prior processing steps (e.g., crystal damage from implant processes), more evenly distribute dopants in various regions of the substrate, and/or activate various regions of the substrate. The process of delivering sequential amounts of energy allows more uniform distribution of the dopants in the exposed regions, due to the improved control of the temperature and diffusion of the dopant atoms in the exposed regions of the substrate. The delivery of small amounts of energy thus allow: 1) improved uniformity and greater control over the distribution of the dopant atoms within a portion of the substrate, 2) removal of defects created in prior processing steps, and 3) a greater control over the previously activated regions of the device.

FIG. 1A illustrates an isometric view of one embodiment of the invention where an energy source 20 is adapted to project an amount of energy on a defined region, or an anneal region 12, of the substrate 10 to preferentially anneal certain desired regions within the anneal region 12. In one embodiment, as shown in FIG. 1A, only one or more defined regions of the substrate, such as anneal region 12, are exposed to the radiation from the energy source 20 at any given time. In one aspect of the invention, a single area of the substrate 10 is sequentially exposed to a desired amount of energy delivered from the energy source 20 to cause the preferential annealing of desired regions of the substrate. In one example, one area on the surface of the substrate after another is exposed by translating the substrate relative to the output of the electromagnetic radiation source (e.g., conventional X/Y stage, precision stages) and/or translating the output of the radiation source relative to the substrate. Typically, one or more conventional electrical actuators 17 (e.g., linear motor, lead screw and servo motor), which may be part of a separate precision stage (not shown), are used to control the movement and position of substrate 10. Conventional precision stages that may be used to support and position the substrate 10, and heat exchanging device 15, may be purchased from Parker Hannifin Corporation, of Rohnert Park, Calif. In another embodiment, a complete surface of the substrate 10 is sequentially exposed all at one time (e.g., all of the anneal regions 12 are sequentially exposed).

In one aspect, the anneal region 12, and radiation delivered thereto, is sized to match the size of the die 13 (e.g., 40 "die" are shown in FIG. 1), or semiconductor devices (e.g., memory chip), that are formed on the surface of the substrate. In one aspect, the boundary of the anneal region 12 is aligned and sized to fit within the "kerf" or "scribe" lines 10A that define the boundary of each die 13. In one embodiment, prior to performing the annealing process the substrate is aligned to the output of the energy source 20 using alignment marks typically found on the surface of the substrate and other conventional techniques so that the anneal region 12 can be adequately aligned to the die 13. Sequentially placing anneal regions 12 so that they only overlap in the naturally occurring unused space/boundaries between die 13, such as the scribe or kerf lines, reduces the need to overlap the energy in the areas where the devices are formed on the substrate and thus reduces the variation in the process results between the overlapping anneal regions. Therefore, the amount of process variation, due to the varying amounts of exposure to the energy delivered from the energy source 20 to process critical regions of the substrate is minimized, since any overlap of delivered energy between the sequentially placed anneal regions 12 can be minimized. In one example, each of the sequentially placed anneal regions 12 are a rectangular region that is about 22 mm by about 33 mm in size (e.g., area of 726 square millimeters ($mm^2$)). In one aspect, the area of each of the sequentially placed anneal regions 12 formed on the surface of the substrate is between about 4 $mm^2$ (e.g., 2 mm×2 mm) and about 1000 $mm^2$ (e.g., 25 mm×40 mm).

The energy source 20 is generally adapted to deliver electromagnetic energy to preferentially anneal certain desired regions of the substrate surface. Typical sources of electromagnetic energy include, but are not limited to, an optical radiation source (e.g., laser, flash lamps), an electron beam source, an ion beam source, and/or a microwave energy source. In one aspect, the substrate 10 is exposed to multiple pulses of energy from a laser that emits radiation at one or more appropriate wavelengths for a desired period of time. In one aspect, the multiple pulses of energy from the energy source 20 are tailored so that the amount of energy delivered across the anneal region 12 and/or the amount of energy delivered over the period of the pulse is optimized so as not to melt the regions on the substrate surface, but to deliver enough energy to controllably allow a significant portion of the dopants in the annealed regions to diffuse, and a significant amount of damage within the annealed regions to be removed one lattice plane, or small group of lattice planes, at one time. Each pulse completes a micro-anneal cycle resulting in some diffusion of dopants from high concentration areas to lower concentration areas, and in epitaxial growth of a few lattice planes of ordered crystal near the bottom of the disordered anneal region. In one aspect, the wavelength of the energy source 20 is tuned so that a significant portion of the radiation is absorbed by a silicon layer disposed on the substrate 10. For an anneal process performed on a silicon containing substrate, the wavelength of the radiation may be less than about 800 nm, and can be delivered at deep ultraviolet (UV), infrared (IR) or other desirable wavelengths. In one embodiment, the energy source 20 is an intense light source, such as a laser, that is adapted to deliver radiation at a wavelength between about 500 nm and about 11 micrometers. In another embodiment, the energy source 20 is a flash lamp array featuring a plurality of radiation-emitting lamps, such as xenon, argon, or krypton discharge lamps. Tungsten halogen lamps may also be used in some embodiments, but they are generally less popular because they cannot be lit and extinguished quickly enough to generate the short pulses required, due to the need to heat and cool a filament. Tungsten halogen lamps, when they are used, must therefore be used with shutters to manage pulses. Also, tungsten halogen lamps generally deliver a lower energy density, so more of them are required. In all cases, the energy pulse used in the anneal process generally takes place over a relatively short time, such as on the order of about 1 nsec to about 10 msec.

Figure 1B:
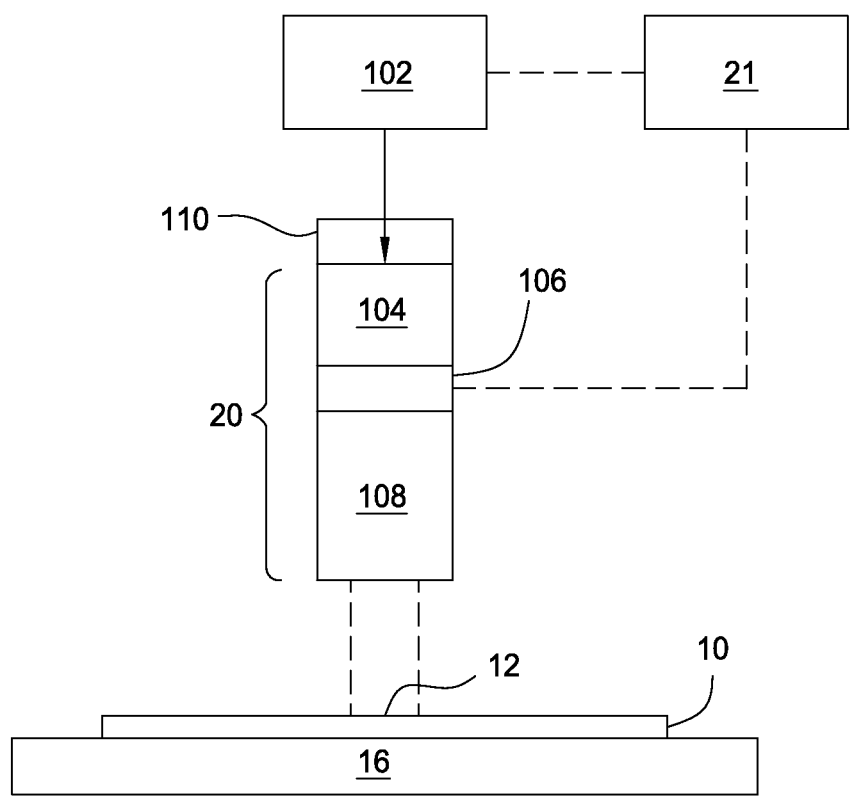
FIG. 1B is a schematic side view of the apparatus of FIG. 1A.

FIG. 1B is a schematic side view of the apparatus of FIG. 1A. A power source 102 is coupled to the energy source 20. The energy source 20 comprises an energy generator 104, which may be a light source such as those described above, and an optical assembly 108. The energy generator 104 is configured to produce energy and direct it into the optical assembly 108, which in turn shapes the energy as desired for delivery to the substrate 10. The optical assembly 108 generally comprises lenses, filters, mirrors, and the like configured to focus, polarize, de-polarize, filter or adjust coherency of the energy produced by the energy generator 104, with the objective of delivering a uniform column of energy to the anneal region 12.

In order to deliver pulses of energy, a switch 106 may be provided. The switch 106 may be a fast shutter that can be opened or closed in 1 µsec or less. Alternately, the switch 106 may be an optical switch, such as an opaque crystal that becomes clear in less than 1 µsec when light of a threshold intensity impinges on it. In some embodiments, the switch may be a Pockels cell. In some embodiments, the optical switch may be configured to change state in less than 1 nsec. The optical switch generates pulses by interrupting a continuous beam of electromagnetic energy directed toward a substrate. The switch is operated by the controller 21, and may be located outside the energy generator 104, such as coupled to or fastened to an outlet area of the energy generator 104, or it may be located inside the energy generator 104. In an alternate embodiment, the energy generator may be switched by electrical means. The controller 21 may be configured to switch the power source 102 on and off as needed, or a capacitor 110 may be provided that is charged by the power source 102 and discharges into the energy generator 104 by virtue of circuitry energized by the controller 21. Electrical switching by capacitor is a way of self-switching, because the energy generator 104 stops generating energy when electricity provided by the capacitor 110 falls below a certain power threshold. When the capacitor 110 is recharged by the power source 102, it can then be discharged into the energy generator 104 to generate another pulse of energy. In some embodiments, the electrical switch may be configured to switch power on or off in less than 1 nsec.

In one embodiment, the annealing process includes an activation anneal step followed by a sequential pulse anneal process to provide a desired device characteristic. In one embodiment, the activation step may include heating the substrate to a temperature between about 400° C. and about 800° C. for a period of time of about 1 minute. In another embodiment, the activation step comprises pre-heating the substrate.

Temperature Control of the Substrate During the Anneal Process

In one embodiment, it may be desirable to control the temperature of the substrate during thermal processing by placing a surface of the substrate 10, illustrated in FIG. 1, in thermal contact with a substrate supporting surface 16 of a heat exchanging device 15. The heat exchanging device 15 is generally adapted to heat and/or cool the substrate prior to or during the annealing process. In this configuration, the heat exchanging device 15, such as a conventional substrate heater available from Applied Materials, Inc., Santa Clara, Calif., may be used to improve the post-processing properties of the annealed regions of the substrate. In general, the substrate 10 is placed within an enclosed processing environment (not shown) of a processing chamber (not shown) that contains the heat exchanging device 15. The processing environment within which the substrate resides during processing may be evacuated or contain a gas suitable to the desired process. For example, embodiments of the present invention may be used in deposition or implant processes that require certain gases be provided to the chamber. The gases may be reactive, such as precursors for deposition processes, or non-reactive, such as inert gases commonly used in conventional thermal processes.

In one embodiment, the substrate may be preheated prior to performing the annealing process so that the incremental anneal energy required is minimized, which may reduce any induced stress due to the rapid heating and cooling of the substrate and also possibly minimize the defect density in the annealed areas of the substrate. In one aspect, the heat exchanging device 15 contains resistive heating elements 15A and a temperature controller 15C that are adapted to heat a substrate disposed on a substrate supporting surface 16. The temperature controller 15C is in communication with the controller 21 (discussed below). In one aspect, it may be desirable to preheat the substrate to a temperature between about 20° C. and about 750° C. In one aspect, where the substrate is formed from a silicon containing material it may be desirable to preheat the substrate to a temperature between about 20° C. and about 500° C.

In another embodiment, it may be desirable to cool the substrate during processing to reduce any inter-diffusion due to the energy added to the substrate during the annealing process. In processes requiring incremental melting of the substrate, cooling afterward may increase regrowth velocity, which can increase the amorphization of the various regions during processing, such as described in conjunction with FIG. 8. In one configuration, the heat exchanging device 15 contains one or more fluid channels 15B and a cryogenic chiller 15D that are adapted to cool a substrate disposed on a substrate supporting surface 16. In one aspect, a conventional cryogenic chiller 15D, which is in communication with the controller 21, is adapted to deliver a cooling fluid through the one or more fluid channels 15B. In one aspect, it may be desirable to cool the substrate to a temperature between about −240° C. and about 20° C.

The controller 21 (FIG. 1A) is generally designed to facilitate the control and automation of the thermal processing techniques described herein and typically may include a central processing unit (CPU) (not shown), memory (not shown), and support circuits (or I/O) (not shown). The CPU may be one of any form of computer processors that are used in industrial settings for controlling various processes and hardware (e.g., conventional electromagnetic radiation detectors, motors, laser hardware) and monitor the processes (e.g., substrate temperature, substrate support temperature, amount of energy from the pulsed laser, detector signal). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. Preferably, the program is software readable by the controller and includes code to monitor and control the substrate position, the amount of energy delivered in each electromagnetic pulse, the timing of one or more electromagnetic pulses, the intensity and wavelength as a function of time for each pulse, the temperature of various regions of the substrate, and any combination thereof.

Selective Heating

In an effort to minimize inter-diffusion between various regions of a formed device, remove defects in the substrate material, and more evenly distribute dopants in various regions of the substrate, one or more processing steps may be performed on various regions of the substrate to cause them to preferentially melt when exposed to energy delivered from an energy source during the anneal process. The process of modifying the properties of a first region of the substrate so that it will preferentially melt rather than a second region of the substrate, when they are both exposed to about the same amount energy during the annealing process, is hereafter described as creating a melting point contrast between these two regions. In general, the substrate properties that can be modified to allow preferential melting of desired regions of the substrate include implanting, driving-in and/or co-depositing one or more elements within desired regions of the substrate, creating physical damage to desired regions of the substrate, and optimizing the formed device structure to create the melting point contrast in desired regions of the substrate. Each of these modification processes will be reviewed in turn.

Figure 2E:
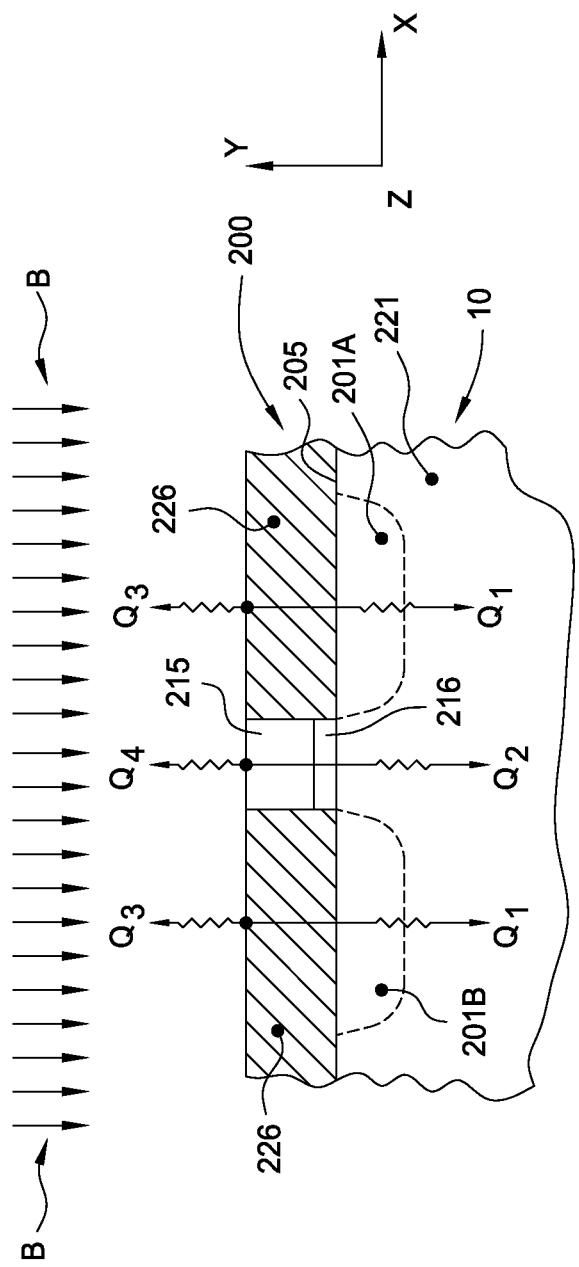

FIGS. 2A-2C illustrate cross-sectional views of an electronic device 200 at different stages of a device fabrication sequence incorporating one embodiment of the invention. FIG. 2A illustrates a side view of typical electronic device 200 formed on a surface 205 of a substrate 10 that has two doped regions 201 (e.g., doped regions 201A-201B), such as a source and drain region of a MOS device, a gate 215, and a gate oxide layer 216. The doped regions 201A-201B are generally formed by implanting a desired dopant material into the surface 205 of the substrate 10. In general, typical n-type dopants (donor type species) may include arsenic (As), phosphorus (P), and antimony (Sb), and typical p-type dopants (acceptor type species) may include boron (B), aluminum (Al), and indium (In) that are introduced into the semiconductor substrate 10 to form the doped regions 201A-201B. FIG. 3A illustrates an example of the concentration of the dopant material as a function of depth (e.g., curve $C_1$), from the surface 205 and into the substrate 10 along a path 203 extending through the doped region 201A. The doped region 201A has a junction depth $D_1$ after the implant process, which may be defined as a point where the dopant concentration drops off to a negligible amount. It should be noted that FIGS. 2A-2E are only intended to illustrate some of the various aspects of the invention and are not intended to be limiting as to the type of device, type of structure, or regions of a device that may be formed using the various embodiments of the invention described herein. In one example, the doped regions 201 (e.g., source or drain regions in a MOS device) can be a raised or lowered relative to the position of the gate 215 (e.g., gate in a MOS device) without varying from the scope of the invention described herein. As semiconductor device sizes decrease, the position and geometry of structural elements of the electronic devices 200 formed on the surface 205 of a substrate 10 may vary to improve device manufacturability or device performance. It should also be noted that the modification of only a single doped region 201A, as shown in FIGS. 2A-2E, is not intended to be limiting as to the scope of the invention described herein and is only meant to illustrate how embodiments of the invention can be used to manufacture a semiconductor device.

FIG. 2B illustrates a side view of the electronic device 200 shown in FIG. 2A during a process step that is adapted to selectively modify the properties of a discrete region (e.g., modified area 210) of the substrate 10, which in this case is a region containing a single doped region 201A, to create a melting point contrast. After performing the modification processes a melting point contrast will be created between the modified area 210 and unmodified areas 211. In one embodiment, the modification process includes the step(s) of adding a material to a layer as it is being deposited on the surface of the substrate, where the incorporated material is adapted to form an alloy with the substrate material to lower the melting point of a region 202 within the modified area 210. In one aspect, the incorporated material is added to the deposited layer during an epitaxial layer deposition process.

In another embodiment, the modification process includes the step of implanting (see "A" in FIG. 2B) a material that is adapted to form an alloy with the substrate material to lower the melting point of a region 202 within the modified area 210. In one aspect, the modification process is adapted to implant the alloying material to a depth $D_2$, as shown in FIG. 2B. FIG. 3B illustrates an example of the concentration of the dopant material (e.g., curve $C_1$) and implanted alloying material (e.g., curve $C_2$) as a function of depth, from the surface 205 and through the substrate 10 along a path 203. In one aspect, where the substrate 10 is formed from a silicon containing material and the implanted alloying materials that may be used include, for example, germanium (Ge), arsenic (As), gallium (Ga), carbon (C), tin (Sn), and antimony (Sb). In general, the alloying material can be any material that when heated in the presence of the substrate base material causes the melting point of the region 202 in the modified area 210 to be lowered relative to the unmodified areas 211. In one aspect, a region of a silicon substrate is modified by the addition of between about 1% and about 20% of germanium to reduce the melting point between the modified and un-modified areas. It is believed that the addition of germanium in these concentrations will lower the melting point of the modified areas versus the un-modified areas by about 300° C. In one aspect, the region 202 formed in a silicon substrate contains germanium (Ge) and carbon (C), so that a $Si_xGe_yC_z$ alloy will form to lower the melting point of the region 202 relative to the unmodified areas 211. In another aspect, a region of a silicon substrate is modified by the addition of about 1% or less of arsenic to reduce the melting point between the modified and un-modified areas. Other important alloys include, but are not limited to, cobalt silicides ($Co_xSi_y$, where y is generally greater than about 0.3x and less than about 3x), nickel silicides ($Ni_xSi_y$, where y is generally greater than about 0.3x and less than about 3x), and nickel-germanium silicides ($Ni_xGe_ySi_z$, where y and z are generally greater than about 0.3x and less than about 3x), as well as other silicides and similar materials.

In another embodiment, the modification process includes the step of inducing some damage to the substrate 10 material in the various modified areas (e.g., modified area 210) to damage the crystal structure of the substrate, and thus make these regions more amorphous. Inducing damage to the crystal structure of the substrate, such as damaging a single crystal silicon substrate, will reduce the melting point of this region relative to an undamaged region due to the change in the bonding structure of atoms in the substrate and thus induce thermodynamic property differences between the two regions. In one aspect, damage to the modified area 210 in FIG. 2B is performed by bombarding the surface 205 of the substrate 10 (see "A" in FIG. 2B) with a projectile that can create damage to the surface of the substrate. In one aspect, the projectile is a silicon (Si) atom that is implanted into a silicon containing substrate to induce damage to the region 202 within the modified area 210. In another aspect, the damage to the substrate material is created by bombarding the surface with gas atoms, such as argon (Ar), krypton (Kr), xenon (Xe) or even nitrogen ($N_2$), using an implant process, an ion beam or biased plasma to induce damage to region 202 of the modified area 210. In one aspect, the modification process is adapted to create a region 202 that has induced damage to a depth $D_2$, as shown in FIG. 2B. It is believed that a dislocation or vacancy density of between about $5 \times 10^{14}$ and about $1 \times 10^{16}/cm^2$ may be useful to create the melting point contrast between a modified area 210 versus an unmodified area 211. In one aspect, FIG. 3B illustrates an example of the concentration of the dopant material (e.g., curve $C_1$) and defects density (e.g., curve $C_2$) as a function of depth, from the surface 205 and through the substrate 10 along a path 203.

It should be noted that while FIGS. 2A-2B illustrate a process sequence in which the modification process is performed after the doping process, this process sequence is not intended to be limiting as to the scope of the invention described herein. For example, in one embodiment, it is desirable to perform the modification process described in FIG. 2B prior to performing the doping process described in FIG. 2A.

FIG. 2C illustrates a side view of the electronic device 200 shown in FIG. 2B that is exposed to radiation "B" emitted from an energy source, such as optical radiation from a laser. During this step the modified area(s) (e.g., modified area 210) and unmodified areas (e.g., 211) disposed across the substrate 10 are exposed to an amount of energy which causes the region 202 in the modified area(s) 210 to selectively melt and resolidify after the pulse of radiation "B" has been applied, while the unmodified areas 211 remain in a solid state. The amount of energy, the energy density and the duration that the radiation "B" is applied can be set to preferentially melt the region 202 by knowing the desired depth of the region 202, the materials used to create the region 202, the other materials used to form the electronic device 200, and the heat transfer characteristics of the components within the formed electronic device 200. As shown in FIGS. 2C and 3C, upon exposure to the radiation "B" the remelting and solidification of the region 202 causes the concentration of the dopant atoms (e.g., curve $C_1$) and alloying atoms (e.g., curve $C_2$) to become more uniformly redistributed in the region 202. Also, the dopant concentration between the region 202 and the substrate bulk material 221 has a sharply defined boundary (i.e., a "hyper-abrupt" junction) and thus minimizes the unwanted diffusion into the substrate bulk material 221. In the embodiment discussed above, in which damage is induced into the substrate 10 to improve the melting point contrast, the concentration of defects (e.g., curve $C_2$) after resolidification will preferably drop to a negligible level.

Modification of Surface Properties

In one embodiment, the properties of the surface over the various regions 202 of the substrate 10 are altered to create thermal contrast between one or more desired regions. In one aspect, the emissivity of the surface of the substrate in a desired region is altered to change the amount of energy absorbed by the substrate surface during processing. In this case, a region that has a higher emissivity can absorb more of the energy received from the energy source 20. When performing an anneal process that involves the melting of the surface of a substrate, the processing temperatures achieved at the surface of the substrate can be quite high (e.g., ~1414° C. for silicon), and because radiative heat transfer is the primary heat loss mechanism, varying the emissivity can have a dramatic effect on the thermal contrast. Therefore, variations in the emissivity of different regions of the substrate surface may have a significant impact on the ultimate temperatures reached by the various regions of the substrate. Regions with low emissivity may, for example, be elevated above the melting point during the annealing process, while regions with high emissivity that have absorbed the same amount of energy may remain substantially below the melting point. Thus, the substrate surface may have regions wherein emissivity per thermal mass at a source wavelength is approximately the same but total emissivity is different. Varying the emissivity of the various surfaces, or emissivity contrast, may be accomplished via selective deposition of a low- or high-emissivity coating onto the substrate surface, and/or modifying the surface of the substrate (e.g., surface oxidation, surface roughening).

In one embodiment, the reflectivity of the surface of the substrate in one or more regions is altered to change the amount of energy absorbed when the substrate 10 is exposed to energy from the energy source. By varying the reflectivity of the surface of the substrate, the amount of energy absorbed and the maximum temperature achieved by the substrate in a region at and below the substrate surface will differ based on the reflectivity. In this case, a surface having a lower reflectivity will achieve a higher temperature than another region that has a higher reflectivity. Varying the reflectivity of the surface of the substrate may be accomplished via selective deposition of a low- or high-reflectance coating onto the substrate surface, and/or modifying the surface of the substrate (e.g., surface oxidation, surface roughening). A highly absorbing (non-reflective) coating may be selectively applied to regions that are intended to be heated more aggressively during the anneal process.

FIG. 2D illustrates one embodiment in which a coating 225 is selectively deposited, or uniformly deposited and then selectively removed, to leave a layer that has a different emissivity and/or reflectivity than the other regions on the surface 205 of the substrate 10. In this case, the heat flow ($Q_1$) in the doped region 201A, below the coating 225, can be adjusted based on the properties of the coating 225 versus the energy absorbed ($Q_2$) in other regions of the substrate 10. In this way, the heat loss ($Q_3$) or reflected from the coating 225 can be varied versus the heat lost ($Q_4$) from the other regions. In one aspect, a carbon containing coating is deposited on the substrate surface by use of a CVD, PVD, or other deposition process.

FIG. 2E illustrates one embodiment in which a coating 226 that alters the optical properties of the surface of the substrate (e.g., emissivity, reflectivity) is deposited over the surface of the substrate, for example over the device shown in FIG. 2A, and then an amount of material is removed to create regions that have differing optical properties. For example, as shown in FIG. 2E, the coating 226 has been removed from the surface of the gate 215, thus leaving the surface of the coating 226 and the surface of the gate 215 exposed to the incident radiation "B." In this case, the coating 226 and the surface of the gate 215 have different optical properties, such as a different emissivity and/or a different reflectivity. The removal process used to expose or create regions that have differing optical properties may be performed by use of a conventional material removal process, such as a wet etch or chemical mechanical polishing (CMP) process. In this case the absorption and heat flow ($Q_1$) in the doped regions 201A-201B, below the coating 226, can be adjusted based on the properties of the coating 226 versus the absorption and heat flow ($Q_2$) in the gate 215 region of the substrate. In this way the heat ($Q_3$) lost or reflected from the coating 226 can be varied versus the heat ($Q_4$) lost or reflected from the gate 215 region.

In one embodiment, the coating 226 contains one or more deposited layers of a desired thickness that either by themselves or in combination modify the optical properties (e.g., emissivity, absorbance, reflectivity) of various regions of the substrate that are exposed to one or more wavelengths of incident radiation. In one aspect, the coating 226 contains layers that either by themselves or in combination preferentially absorb or reflect one or more wavelengths of the incident radiation "B." In one embodiment, the coating 226 contains a dielectic material, such as fluorosilicate glass (FSG), amorphous carbon, silicon dioxide, silicon carbide, silicon carbon germanium alloys (SiCGe), nitrogen containing silicon carbide (SiCN), a BLOk™ dielectric material made by a process that is commercially available from Applied Materials, Inc., of Santa Clara, Calif., or a carbon containing coating that is deposited on the substrate surface by use of a chemical vapor deposition (CVD) process or atomic layer deposition (ALD) process. In one aspect, coating 226 contains a metal, such as, but not limited to, titanium (Ti), titanium nitride (TiN), tantalum (Ta), cobalt (Co), or ruthenium (Ru).

It should be noted that the various embodiments discussed herein may be used in conjunction with each other in order to further increase the process window. For example, a selectively deposited, light absorbing coating may be used in conjunction with doping of certain defined regions to broaden the process window of the anneal process.

Tuning the Energy Source Output to Achieve Preferential Heating

As noted above, the energy source 20 is generally adapted to deliver electromagnetic energy to preferentially melt certain desired regions of the substrate 10. Typical sources of electromagnetic energy include, but are not limited to, an optical radiation source (e.g., laser (UV, IR, etc. wavelengths)), an electron beam source, an ion beam source, and/or a microwave energy source. In one embodiment of the invention, the energy source 20 is adapted to deliver optical radiation, such as a laser, to selectively heat desired regions of a substrate to the melting point.

In one aspect, the substrate 10 is exposed to a pulse of energy from a laser that emits radiation at one or more appropriate wavelengths, and the emitted radiation has a desired energy density (W/cm$^2$) and/or pulse duration to enhance preferential melting of certain desired regions. For laser annealing processes performed on a silicon containing substrate, the wavelength of the radiation is typically less than about 800 nm. In either case, the anneal process generally takes place on a given region of the substrate for a relatively short time, such as on the order of about one second or less. The desired wavelength and pulse profile used in an annealing process may be determined based on optical and thermal modeling of the laser anneal process in light of the material properties of the substrate.

FIGS. 4A-4D illustrate various embodiments in which the various attributes of the pulse of energy delivered from an energy source 20 to an anneal region 12 (FIG. 1) are adjusted as a function of time to achieve improved thermal contrast and anneal process results. In one embodiment, it is desirable to vary the shape of a laser pulse as a function of time, and/or vary the wavelengths of the delivered energy to enhance the heat input into regions of the substrate intended to be melted and minimize the heat input into other regions. In one aspect, it may also be desirable to vary the energy delivered to the substrate.

Figure 4A:
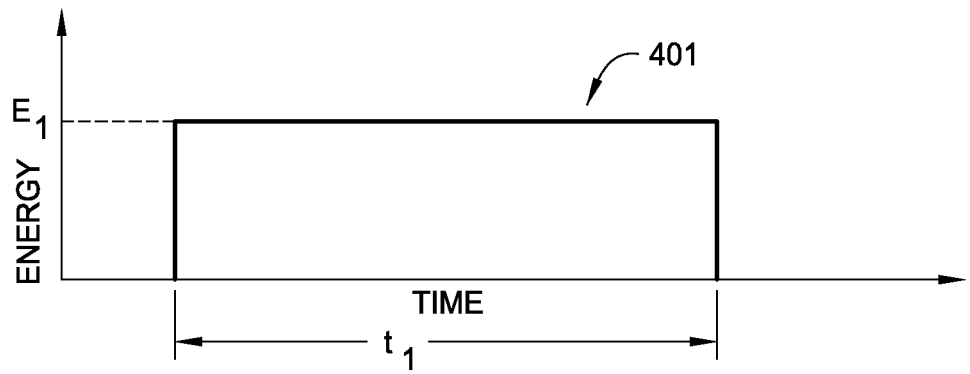
FIGS. 4A-4G are graphs of energy pulses illustrating some embodiments of the invention.

FIG. 4A graphically illustrates a plot of delivered energy versus time of a single pulse of electromagnetic radiation (e.g., pulse 401) that may be delivered from the energy source 20 to the substrate 10 (see FIG. 1). The pulse illustrated in FIG. 4A is generally a rectangular pulse that delivers a constant amount of energy ($E_1$) for the complete pulse duration ($t_1$).

Figure 4B:
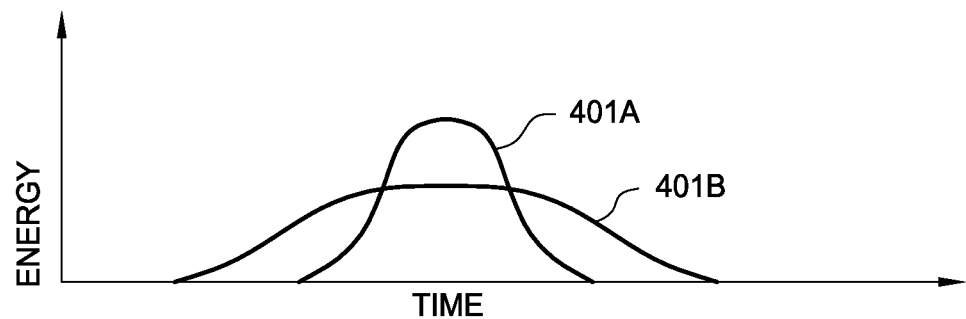

In one aspect, the shape of the pulse 401 may be varied as a function of time as it is delivered to the substrate 10. FIG. 4B graphically illustrates a plot of two pulses 401A, 401B of electromagnetic radiation that may be delivered from one energy source 20 to the substrate 10 that have a different shape. In this example, each pulse may contain the same total energy output, as represented by the area under each curve, but the effect of exposing regions of the substrate 10 to one pulse versus another pulse may improve the melting point contrast experienced during the anneal process. Therefore, by tailoring the shape, peak power level and/or amount of energy delivered in each pulse the anneal process may be improved. In one aspect, the pulse is gaussian shaped.

Figure 4C:
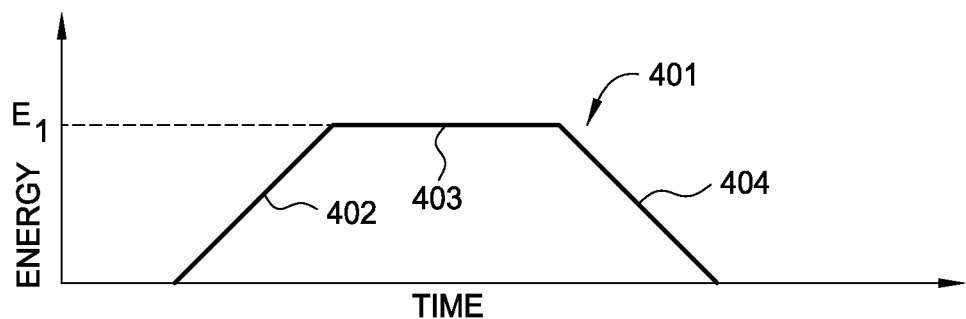

FIG. 4C graphically illustrates a pulse of electromagnetic radiation (e.g., pulse 401) that is trapezoidal in shape. In this case, in two different segments (e.g., 402 and 404) of the pulse 401 the energy delivered is varied as a function of time. While FIG. 4C illustrates a pulse 401 profile, or shape, in which the energy versus time varies in a linear fashion, this is not intended to be limiting as to the scope of the invention since the time variation of the energy delivered in a pulse may, for example, have a second degree, third degree, or fourth degree shaped curve. In another aspect, the profile, or shape, of the energy delivered in a pulse as a function of time may be a second order, a third order, or exponential-shaped curve. In another embodiment, it may be advantageous to use a pulse having different shapes (e.g., rectangular and triangular modulation pulse, sinusoidal and rectangular modulation pulse, rectangular, triangular and sinusoidal modulation pulse, etc.) during processing to achieve the desired annealing results.

Depending on the properties of the various regions of the device, the shape of the delivered pulse of electromagnetic radiation may be tailored to improve the anneal process results. Referring to FIG. 4B, for example, in some situations in which various regions of a substrate to be heated during the anneal process are thermally isolated from other regions of the device by areas that have a low thermal conductivity, use of a pulse having a shape similar to pulse 401B may be advantageous. A pulse having a longer duration may be advantageous, because the more thermally conductive material regions of the substrate will have more time to dissipate the heat by conduction, while the regions that are to be annealed are more thermally isolated resulting in higher temperatures in those regions. In this case the duration, peak power level and total energy output of the pulse can be appropriately selected, so that the areas that are not intended to be annealed will remain cooler. The process of tailoring the shape of the pulse may also be advantageous when surfaces of varying emissivity are used to create a melting point contrast.

Referring to FIG. 4C, in one embodiment, the slope of the segment 402, the shape of the pulse 401, the shape of the segment 403, the time at a power level (e.g., segment 403 at the energy level $E_1$), the slope of the segment 404, and/or the shape of the segment 404 are adjusted to control the annealing process. It should be noted that it is generally not desirable to cause the material within the annealed regions to vaporize during processing due to particle and process result variability concerns. It is therefore desirable to adjust the shape of the pulse of energy to rapidly bring the temperature of the annealed region to a target temperature without superheating the region and causing vaporization of the material. In one embodiment, as shown FIG. 4G, the shape of the pulse 401 may adjusted so that it has multiple segments (i.e., segments 402, 403A, 403B, 403C, and 404) are used to rapidly bring the anneal region to a target temperature and then hold the material at that temperature for a desired period of time (e.g., $t_1$), while preventing vaporization of material within the annealing region. The length of time, the shape of the segments and the duration of each of the pulse segments may vary as the size, melt depth, and the material contained within the annealing regions is varied.

Figure 4D:
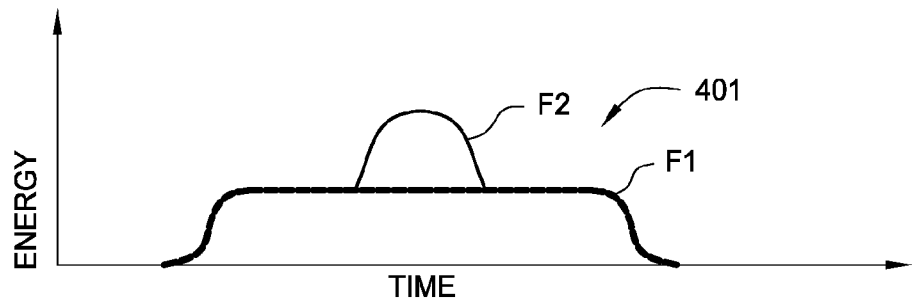

In another aspect, multiple wavelengths of radiant energy may be combined to improve the energy transfer to the desired regions of the substrate to achieve an improved thermal contrast, and/or improve the anneal process results. In one aspect, the amount of energy delivered by each of the combined wavelengths is varied to improve the thermal contrast, and improve the anneal process results. FIG. 4D illustrates one example in which a pulse 401 contains two wavelengths that may deliver differing amounts of energy per unit time to a substrate 10 in order to improve the thermal contrast and/or improve the anneal process results. In this example, a frequency F1 is applied to the substrate at a constant level over the period of the pulse and another frequency F2 is applied to the substrate 10 at a constant level for most of the period except for a portion that peaks for a period of time during the period of the pulse.

Figure 4E:
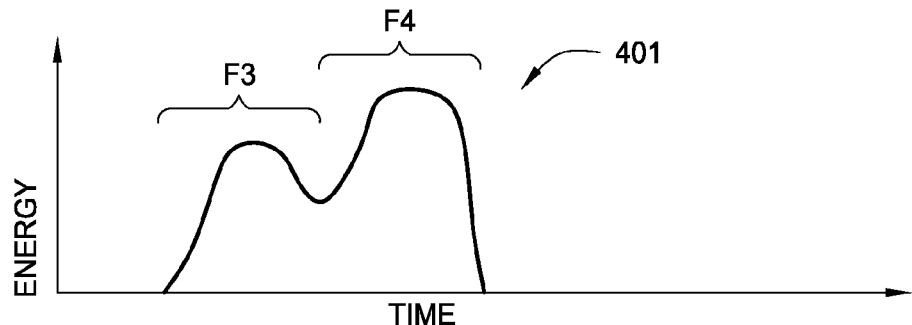

FIG. 4E graphically illustrates a plot of a pulse 401 that has two sequential segments that deliver energy at two different frequencies F3 and F4. Therefore, since various regions of the substrate may absorb energy at different rates at different wavelengths, the use of pulse that contains multiple wavelengths that can deliver variable amounts of energy, as shown in FIGS. 4D and 4E, may be advantageous to achieve desirable annealing process results.

Figure 4F:
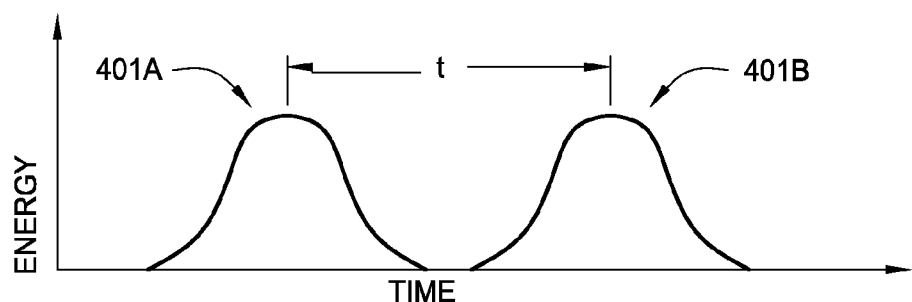
Figure 4G:
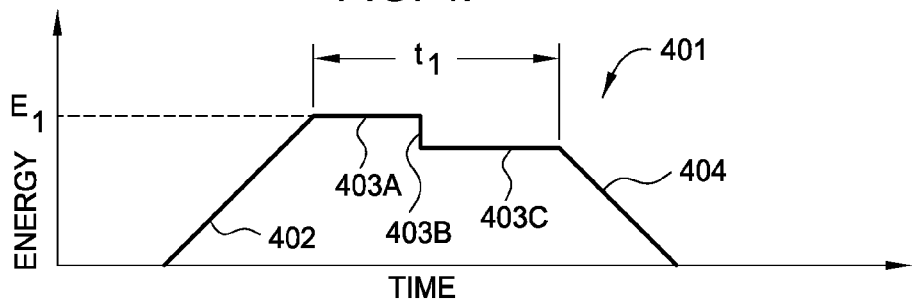

In one embodiment, two or more pulses of electromagnetic radiation are delivered to a region of the substrate at differing times so that the temperature of regions on the substrate surface can be easily controlled. FIG. 4F graphically illustrates a plot of two pulses 401A and 401B that are delivered a varying distance in time apart, or period (t), to selectively heat certain regions on the surface of a substrate. In this configuration, by adjusting the period (t) between the subsequent pulses, the peak temperature reached by regions on the substrate surface can be easily controlled. For example, by reducing the period (t), or frequency, between pulses the heat delivered in the first pulse 401A has less time to dissipate before the second pulse 401B is delivered, which will cause the peak temperature achieved in the substrate to be higher than when the period between pulses is increased. By adjusting the period in this way, the energy and temperature can be easily controlled. In one aspect, it may desirable to assure that each pulse by itself does not contain enough energy to cause the substrate to reach the target temperature, but the combination of the pulses causes the regions 202 to reach the target temperature. This process of delivering multiple pulses, such as two or more pulses, will tend to reduce the thermal shock experienced by the substrate material versus delivering a single pulse of energy. Thermal shock can lead to damage of the substrate and generate particles that will create defects in subsequent processing steps performed on the substrate.

Referring to FIG. 4F, in one embodiment, two or more energy sources, such as lasers, are operated in sequence so as to shape the thermal profile of the surface of a substrate as a function of time. For example, one laser or an array of lasers may deliver a pulse 401A that elevates the surface of the substrate to a temperature $T_o$ for a time $t_1$. Prior to or at the end of $t_1$, a second pulse 401B is delivered from a second laser, or from multiple lasers operating in tandem, that brings the substrate temperature to a temperature $T_1$ for a time $t_2$. The thermal profile can thus be shaped by controlling the sequencing pulses of energy delivered from the multiple lasers. This process may have thermal processing benefits, such as, but not limited to, the application of controlling dopant diffusion and the direction of the dopant diffusion.

Electromagnetic Radiation Pulses

For the purpose of delivering sufficient electromagnetic radiation to the surface of a silicon containing substrate, or substrate comprised of another material requiring thermal processing, the following process controls may be used.

In one embodiment, two or more electromagnetic energy sources, such as lasers, are operated in sequence so as to shape the thermal profile of the surface being thermally processed and where the lasers are operated in such a manner as to correct for pulse-to-pulse energy variations. In one aspect, the energy source 20, schematically illustrated in FIG. 1A, contains two or more electromagnetic energy sources, such as, but not limited to, an optical radiation source (e.g., laser or flash lamp), an electron beam source, an ion beam source, and/or a microwave energy source. The pulse-to-pulse energy from a device such as a pulsed laser may have a percent variation of each pulse. The variation in pulse energy may be unacceptable for the substrate thermal process. To correct for this pulse variation, one or more laser(s) deliver a pulse that elevates the substrate temperature. Then an electronic controller (e.g., controller 21 in FIG. 1), which is adapted to monitor the pulses delivered and the energy, or rise time, of the pulse that is in delivery, is used to calculate the amount of energy required to "trim" or adjust the thermal profile (e.g., temperature of a region of the substrate as a function of time) so that it is within process targets and command a second smaller laser or series of smaller lasers to deliver the final energy to complete the thermal processing. The electronic controller generally uses one or more conventional radiation detectors to monitor the energy and/or wavelength of pulses delivered to the substrate. The smaller lasers may also have peak-to-peak variation in pulse output energy, but because they deliver substantially less energy per pulse than the initial pulse (or pulses) at the start of the surface treatment this error will generally be within process limits. The electronic controller is thus adapted to compensate for the variation in energy delivered by a pulse, and thus assure that a desired energy level is delivered during the thermal process.

In one aspect, the two or more energy sources, discussed above, may also be implemented using a single color (wavelength) of laser light with a bandwidth of color frequency, multiple wavelengths, single or multiple temporal and spatial laser modes, and polarization states.

The output of the laser or lasers will likely not have the correct spatial and temporal energy profile for delivery to the substrate surface. Therefore, a system using microlenses to shape the output of the lasers is used to create a uniform spatial energy distribution at the substrate surface. Selection of glass types and geometry of the microlenses may compensate for thermal lensing effects in the optical train necessary for delivering the pulsed laser energy to the substrate surface.

High frequency variations in pulse energy at the substrate surface, known as speckle, is created by neighboring regions of constructive and destructive phase interference of the incident energy. Speckle compensation may include the following: a surface acoustic wave device for rapidly varying the phase at the substrate such that this rapid variation is substantially faster than the thermal processing time of the laser pulse or pulses; pulse addition of laser pulses; alternating polarization of laser pulses for example, delivery of multiple simultaneous or delayed pulses that are linearly polarized but have their polarization states (e-vectors) in a nonparallel condition.

Electromagnetic Radiation Delivery

Figure 5:
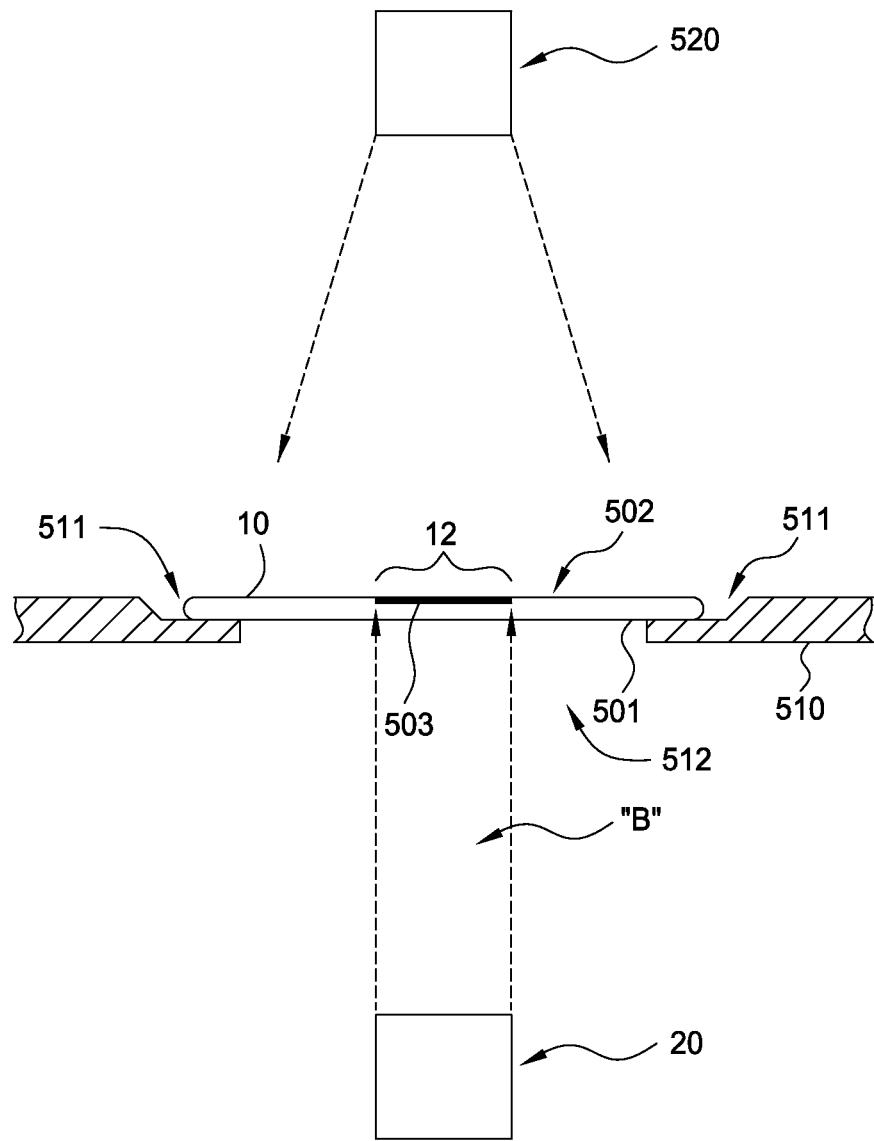
FIG. 5 is a schematic diagram of a system according to an embodiment of the invention.

FIG. 5 is a cross-sectional view of a region of a processing chamber that illustrates one embodiment in which an energy source 20 is adapted to deliver an amount of energy to an anneal region 12 of the substrate 10 from the backside surface 501 to preferentially melt certain desired regions within the anneal region 12. In one aspect, one or more defined regions of the substrate, such as anneal region 12, are exposed to the radiation from the energy source 20 at any given time. In one aspect, multiple areas of the substrate 10 are sequentially exposed to a desired amount of energy delivered through the backside surface 501 from the energy source 20 to cause the preferential melting of desired regions of the substrate. In one aspect, the anneal region 12 is sized to match the size of the die (e.g., item #13 in FIG. 1A), or semiconductor devices, that are formed on the top surface 502 of the substrate 10. In one aspect, the boundary of the anneal region 12 is aligned and sized to fit within the "kerf" or "scribe" lines that define the boundary of each die. Therefore, the amount of process variation due to the varying amount of exposure to the energy from the energy source 20 is minimized, since any overlap between the sequentially placed anneal regions 12 can be minimized. In one example, the anneal region 12 is a rectangular region that is about 22 mm by about 33 mm in size.

In one embodiment, the substrate 10 is positioned in a substrate supporting region 511 formed on a substrate support 510 that has an opening 512 that allows the backside surface 501 of the substrate 10 to receive energy delivered from the energy source 20. The need to direct radiation to the backside of substrate 10 makes an opening in support 510 necessary. Other embodiments of the present invention do not require the ring-type substrate support. Referring to FIG. 5, the radiation "B" emitted from the energy source 20 heats regions 503 that are adapted to absorb a portion of the emitted energy. The energy source 20 may be adapted to deliver electromagnetic energy to preferentially melt certain desired regions of the substrate surface. For this embodiment, typical sources of electromagnetic energy include, but are not limited to, an optical radiation source (e.g., laser) and/or a microwave, infrared or near-infrared, or UV energy source. In one aspect, the substrate 10 is exposed to a pulse of energy from a laser that emits radiation at one or more appropriate wavelengths for a desired period of time. In one aspect, pulse of energy from the energy source 20 is tailored so that the amount of energy delivered across the anneal region 12 and/or the amount of energy delivered over the period of the pulse is optimized to achieve a desired thermal treatment of certain areas. In one aspect, the wavelength of the laser is tuned so that a significant portion of the radiation is absorbed by a silicon layer disposed on the substrate 10. For laser anneal processes performed on a silicon containing substrate, the wavelength of the radiation is typically greater than about 900 nm, but may be delivered at deep ultraviolet (UV), infrared (IR) or other desirable wavelengths. In either case, the anneal process generally takes place on a given region of the substrate for a relatively short time, such as on the order of about one second or less.

In one aspect, the wavelength of the emitted radiation from the energy source 20 is selected so that the bulk material from which the substrate is formed is more transparent to the incident radiation than the areas near the top surface 502 that are to be heated by the exposure of the incident emitted radiation. In one aspect, the regions that are to be heated contain a material that absorbs an amount of the energy delivered through the backside of the substrate, such as a dopant material or ionizing crystal damage (e.g., crystal defects, Frenkel defects, vacancies) created during the implantation process. In general the dopant materials may be boron, phosphorous, or other commonly used dopant material used in semiconductor processing. In one embodiment, the bulk material from which the substrate is formed is a silicon containing material and the wavelength of the emitted radiation is greater than about 1 micrometer. In another aspect, the energy source 20 contains a $CO_2$ laser that is adapted to emit principal wavelength bands centering around 9.4 and 10.6 micrometers. In yet another aspect, the energy source 20 is adapted to deliver wavelengths in the infrared region, which is generally between about 750 nm and about 1 mm.

In one embodiment, an absorbing coating (not shown) is disposed over the anneal region 12 on the substrate 10 so that the incident radiation delivered through the back of the substrate can be absorbed before it passes through the substrate. In one aspect, the absorbing coating is a metal, such as titanium, titanium nitride, tantalum, or other suitable metal material. In another aspect, the absorbing coating is a silicon carbide material, a carbon-containing material such as an amorphous carbon material or doped diamond-like carbon, or other suitable material that is commonly used in semiconductor device manufacturing.

In one embodiment, two wavelengths of light are delivered to the desired regions of the substrate, so that the first wavelength of light is used to generate free carriers (e.g., electrons or holes) in the substrate from dopants or other ionizing crystal damage found in the desired annealing regions, so that the generated free carriers will absorb the energy delivered through the back of the substrate at a second wavelength. In one aspect, the first wavelength is the wavelength of "green light" (e.g., about 490 nm to about 570 nm) and/or shorter wavelengths. In one embodiment, the first wavelength is delivered at a desirable power density (W/cm$^2$) to the desired region of the substrate from a second source 520 that is on the opposite side of the substrate from the energy source 20, shown in FIG. 5. In another embodiment, the two wavelengths (e.g., first and second wavelengths) are delivered through the backside of the substrate from the energy source 20. In yet another embodiment, the two wavelengths (e.g., first and second wavelengths) at desirable power densities (W/cm$^2$) are delivered through the backside of the substrate from two separate sources of electromagnetic energy (not shown).

Pulse Train Annealing

To address the challenges of next-generation device fabrication, an annealing process that uses a plurality of pulses of electromagnetic radiation, or Pulse Train Annealing, is useful in some processes. A plurality of identical pulses of electromagnetic radiation are delivered to a substrate, each pulse accomplishing a single micro-anneal process that heats a few atomic layers of a substrate surface to a submelt temperature, such as about 1300° C. for a silicon substrate, in 1 millisecond (msec) or less and then allowing the imparted energy to completely dissipate within the crystal lattice such that the temperature of the affected lattice layers returns to a lower temperature near a controlled preheat temperature. The preheat temperature is the temperature at which the substrate is maintained just prior to the delivery of the first pulse, and may be between about 400° C. and about 800° C. In each micro-anneal cycle, silicon and dopant atoms not bound to the crystal lattice are moved fractions of an atomic radius. Those bound to the lattice will generally not move because they do not receive enough energy from the delivered pulse. In this way, each micro-anneal cycle moves individual interstitial atoms and dopant atoms into desired lattice positions. As the interstitial atoms or dopants fill lattice positions, other interstitial atoms or dopants that are not so located diffuse through the substrate until they find a desirable position within the crystal lattice. In this way, Pulse Train Annealing (hereinafter "PTA") can be used to control the atomic positions of interstitial atoms or dopants within a crystal lattice and controllably repair lattice defects formed during prior processing steps (e.g., implant processes) without driving over-diffusion. PTA is thus a process that can be used to control the movement of atoms within the semiconductor device at atomic length scales.

FIG. 6A is a flow chart illustrating a process according to one embodiment of the invention. FIGS. 6B-6D illustrate properties of a target substrate at various stages of the process 600. In one embodiment, a substrate may be annealed by delivering a plurality of electromagnetic energy pulses to the substrate surface, each pulse configured to perform a micro-anneal process on at least a portion of the substrate. The energy emissions may be generated by any collection of the foregoing sources, including lasers, flash lamps, and UV and microwave sources. In some embodiments, the energy emissions take the form of short-duration pulses as described above, each pulse ranging in duration from about 1 nsec to about 10 msec. Each pulse will generally deliver an energy density of about 0.2 J/cm$^2$ to about 100 J/cm$^2$. In one embodiment, for example, the energy density delivered by each pulse is about 0.5 J/cm$^2$. The wavelength of light used for the pulses is selected to cause an optimum movement of atoms in the crystal lattice of the substrate. In some embodiments of the invention pulses of energy are delivered at wavelengths that are within the infrared spectrum. Other embodiments use pulses of light that are within the UV spectrum or combine wavelengths from different spectra.

Intending not to be bound by theory, it is believed that PTA allows atomic level control of movement of atoms within the substrate by delivering a plurality of pulses of electromagnetic radiation, wherein each pulse executes a complete micro-anneal cycle. Each pulse of electromagnetic radiation delivered to or absorbed by a surface of a substrate provides energy to atoms that are at or near the substrate surface. The delivered energy induces movement of the atoms, some of which change position within the lattice. Whether it causes atoms to relocate or not, the incident energy is transmitted through the substrate material in all directions, such as laterally across the surface of the substrate, and vertically into the substrate. The energy delivered in each pulse generally creates an acoustic wave which can be detected by a detector, such as an acoustic (e.g., sound) detector or by a photoacoustic detector that is configured to detect properties of the waves of energy propagating through the substrate. The detected properties may include amplitude, frequency, and phase. Fourier analysis of the signal may yield a monitoring process analogous to pyrometry that may be used for feedback control. The raw signal may be provided to a controller, such as the controller 21 of FIGS. 1A and 1B, which may be configured to generate a control signal to adjust the energy delivered to the substrate. The controller may adjust the power input to each pulse, or the frequency or duration of pulses.

Embodiments of the present invention provide methods for preferentially causing slight movements of individual atoms within a crystal lattice by imparting pulses of electromagnetic radiation to a surface of a substrate. As discussed above, the radiation may be delivered to regions of the substrate surface, or to the entire surface of the substrate at once. The wavelength and intensity of the radiation may be selected to target individual atoms within the crystal lattice. For example, a doped single crystal silicon substrate will have a crystal lattice of mostly silicon atoms with some dopant atoms positioned in interstial sites or at crystal lattice sites. In some cases, the concentration of dopants, as well as the concentration of crystalline damage from the process of implanting the dopants may be excessive. In one embodiment, a pulse of electromagnetic radiation may be designed to cause the incremental movement of dopant atoms from one plane of the lattice to another to correct local concentration variations of dopants and crystal damage. The intensity and wavelength may be tuned depending on the depth of the dopant atoms and the amount of movement desired. Wavelengths of energy used may range generally from the microwave, for example about 3 cm, through visible wavelengths, into the deep ultraviolet, for example about 150 nanometers (nm). Wavelengths ranging from about 300 nm to about 1100 nm, for example, may be used in laser applications, such as wavelengths less than about 800 nm. Effect of the longer wavelengths may be enhanced by providing carrier radiation comprising green light that illuminates the surface of the substrate. A pulse of electromagnetic radiation may also be designed to cause incremental movement of silicon atoms within the silicon lattice formed on the substrate surface in a similar fashion. Delivering multiple pulses of such radiation results in the controllable movement of atoms to a degree dependent on the number of pulses delivered. Thus, it is possible to selectively repair crystal lattice damage from implant processes, such as surface damage and end-of-range damage, and to selectively adjust local concentration and distribution of dopant atoms within the lattice.

In step 602, pulses of electromagnetic radiation, such as laser or flash lamp emissions, may be used to irradiate a substrate. The pulses may have duration between 10 nsec and about 20 msec. Each pulse that strikes the substrate surface will produce a vibration in the crystal lattice that propagates through the substrate. If the interval between pulses is long enough, the vibration energy is dissipated within the crystal lattice and radiates away as heat. The vibration energy imparted to the crystal lattice by a pulse delivering between about 0.2 J/cm$^2$ and about 100 J/cm$^2$ of energy to the surface of a substrate may dissipate as heat and radiate away within about 1 microsecond (μsec) following the end of the pulse. If the interval between pulses is shorter than the time required to dissipate the heat delivered by the individual pulses, heat builds up in the lattice, and the temperature of the lattice rises. This condition approximates standard rapid thermal annealing or spike annealing, in which the substrate is heated to a temperature below its melting point but high enough to allow diffusion and rearrangement of lattice atoms. Conventional thermal annealing processes struggle to control the average diffusion length of the atoms when the desired diffusion length is very small, such as only a few nanometers. Current conventional rapid thermal annealing (RTA) systems use lamps and supporting circuitry that can only deliver energies over periods that are greater than about 0.25 seconds. The thermal communication time, or time it takes heat to diffuse from the front surface to the back surface of the substrate, is on the order of 20 msecs. Therefore, conventional RTA chambers are not able to adequately control the diffusion processes for 45 nm or 32 nm node devices and smaller, because the delivered energy heats the whole substrate causing unwanted diffusion of dopants and other atoms within all areas of the substrate. Also, it is believed that if the interval between delivered pulses is long enough, the additive effects of each pulse will not cause temperature to rise in the substrate, and thus the thermal effects of each pulse will be localized to areas just below the surface of the substrate, for example up to about 100 Angstroms or more below the surface depending on pulse duration and intensity. Although it is preferred for each pulse to deliver the same energy, in some embodiments it may be advantageous to deliver pulses with energy that varies according to a predetermined recipe, such as, for example, ramping up or down in desired patterns.

Figure 10:
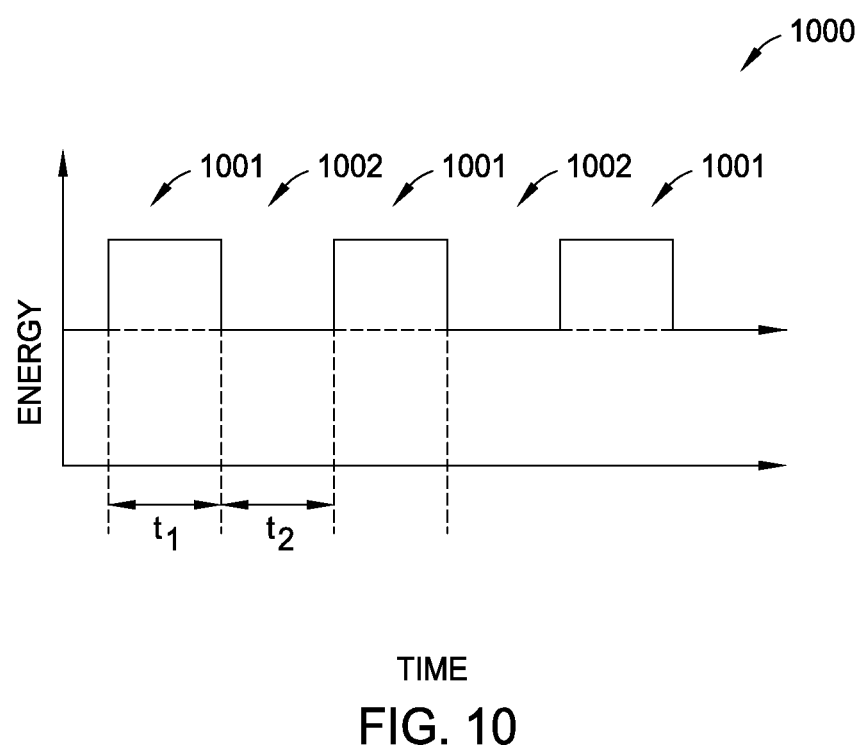
FIG. 10 is a graph showing energy pulses according to an embodiment of the invention.

In some embodiments, pulses of 10 nsec may be followed by intervals of 1 msec or more where no energy is delivered to the substrate surface (e.g., "rest" period). As shown in FIG. 10, in one embodiment it is desirable to deliver a series of pulses 1000 in which a single pulse of electromagnetic energy, or pulse 1001, having a magnitude $E_1$ and duration $t_1$, is delivered to the substrate surface, followed by a "rest" period 1002 having a duration $t_2$ in which no energy is delivered to the surface of the substrate before the next pulse 1001 is received. In one embodiment, the duration $t_1$ is between about 1 msec and about 10 msecs and the duration $t_2$ is between about 1 ms to 20 ms. In one embodiment, each pulse 1001 that is delivered during the annealing process delivers the same amount of total energy over the same pulse duration. Referring to FIG. 10, while the single pulses of energy 1001 are shown as square wave pulses, this shape is not intended to be limiting as to the scope of the invention described herein, because the shape of the delivered energy could be triangular in shape, Gaussian in shape, or any other desirable shape.

It should be noted that the traditional definition of temperature, or temperature gradients, lose their meaning at the desired annealing depths for the 45 nm and 32 nm device nodes, due to small number of lattice planes or atoms affected by short pulses of energy. It is believed that the local temperature near the surface of a substrate subjected to pulses of electromagnetic radiation in accordance with the invention can be momentarily elevated to 300-1400° C., as embodied by vibration of a small number of atoms in the crystal lattice. In other embodiments, pulses of light from flash lamps may be used in which pulses of energy between about 0.2 J/cm$^2$ and about 100 J/cm$^2$ may be delivered over a period between about 10 nsecs and about 10 msecs.

FIG. 6B illustrates a substrate having a doped region 113. Doped region 113, immediately following implantation and prior to annealing, has an implanted layer of dopant atoms or ions 650. This layer is produce by the process of implanting the ions, which generally creates a distribution of atoms within the crystal lattice with the highest concentration of atoms being near the substrate surface, and lower concentration deeper into the substrate. Layer 650 represents the locality of highest dopant concentration within region 113. If region 113 was amorphized prior to implantation, the layers of region 113 immediately above and below implantation layer 650 may still be amorphous. If region 113 was not amorphized prior to implantation, the layer of region 113 immediately below implantation layer 650 will be a substantially ordered crystal lattice, whereas the layer of region 113 immediately above the implantation layer 650 will exhibit numerous crystal defects generated by the forcible passage of dopant atoms through the crystal lattice structure. In either case, the object of annealing is to reorder the crystal structure of region 113, distribute the dopant atoms throughout region 113 at regular locations in the crystal lattice, and recrystallize or order the lattice structure of region 113. Such annealing activates the dopant atoms, supplying region 113 with electrons or holes as appropriate, and reduces resistivity of region 113 from lattice defects.

In some embodiments, a plurality of pulses are used to achieve desired effects within the crystal lattice. A plurality of pulses numbering from 10 to 100,000 may be used to generate movement of atoms ranging from about a single lattice plane, or about one atomic distance, to a number of lattice planes, or a number of atomic distances. In one embodiment, at least 100 pulses are used to anneal a substrate. In another embodiment, between about 30,000 and about 70,000 pulses, such as about 50,000 pulses, are used to anneal a substrate. The number of pulses will generally be less than about 100,000 because the anneal process will reach an end point, beyond which no further annealing is accomplished. As discussed above, each pulse accomplishes a complete micro-anneal cycle. Each pulse may only be energetic enough to cause movement of some dopants or silicon atoms a distance less than the separation distance of individual lattice planes, resulting in slight incremental activation or crystal repair. Allowing the pulse energy to dissipate completely within the substrate freezes the movement prior to application of the next pulse. Adjusting the number of pulses in this way allows control of diffusion and rearrangement of atoms within the crystal lattice.

The effect of incident electromagnetic radiation on the surface of the substrate is to impart kinetic energy to the atoms in the lattice, which is transmitted through the substrate. Another embodiment of the invention provides for monitoring the effect of the radiation on the substrate by detecting the acoustic result of the lattice vibration. FIG. 6C and step 604 in FIG. 6A illustrate monitoring the acoustic response of the substrate, represented by sound waves 652 radiating from substrate 100. The acoustic response indicates the degree to which vibration energy is being absorbed in the substrate, which provides some information regarding the movement of dopant and interstitially positioned atoms. As lattice order increases, lattice defects decrease, and redistribution of atoms decreases, the acoustic response of the substrate may change from tending to absorb the incident energy to transmitting more of the energy. In this way, an endpoint may be detected, as in step 606, beyond which little annealing occurs. In one embodiment, an acoustic detector 654 is disposed within the process chamber to measure the sound of the acoustic response of the substrate as electromagnetic radiation pulses creates acoustic waves in the lattice. In this case, the acoustic detector 654 may be positioned adjacent to a surface of the substrate so that it can detect the acoustic waves created by the delivery of the electromagnetic pulse of energy.

In another embodiment, a photoacoustic detector may be disposed within the chamber to measure the acoustic waves induced by the incident electromagnetic pulses on a reflected beam of light from a surface of the substrate, as illustrated schematically in FIG. 6E. In some embodiments, the acoustic response may be measured from the same surface of the substrate to which the pulses are delivered, and in some embodiments it may be measured on a different surface of the substrate, such as the opposite side if the substrate is a wafer. FIG. 6E illustrates a photoacoustic detector used to detect the acoustic response on substrate 100 as pulses of electromagnetic energy are delivered to the substrate surface according to one embodiment. Source 656 directs low-power electromagnetic energy 660A toward the device side of substrate 100, and detector 658 receives the reflected radiation 660B. The electromagnetic pulses received by substrate 100 will result in short-duration displacements of the surface of substrate 100, which in turn will affect the reflected energy 660B. This reflected light is then detected by detector 658, and may be analyzed to monitor the amount of change in the substrate 100's response to the received energy as the anneal progresses. As the crystal structure changes, the acoustic response of the substrate will change, and an end point may be detected as in step 606 of FIG. 6A. FIG. 6F illustrates an alternate embodiment of a photoacoustic detector monitoring acoustic effects from the back side of the substrate. Detectors may similarly be deployed to detect changes in reflectivity, transmissivity, or absorptivity of a substrate from any surface or side and any convenient angle.

In other embodiments, low energy pulses may be used in a pre-treatment process step to help decide how much energy is required to accomplish the desired lattice repair and dopant reconfiguration. This process sequence is illustrated in FIGS. 7A-7E. In step 702, low energy pulses are directed onto a surface of the substrate, as illustrated in FIG. 7B. Pulses 750 may be of intensity well below what is needed to anneal doped region 113 of substrate 100. Pulses 750 generate an acoustic response in the substrate which may be monitored and recorded, as in step 704. Acoustic detector 752 may be disposed to record the acoustic response from the substrate, as illustrate in FIG. 7C. Analysis of the acoustic response, step 706, may be performed by an analyzer, schematically represented in FIG. 7C by item 754. Analyzer 754 may comprise a computer configured to receive the acoustic signals, review and analyze the signal (i.e., highlight meaningful patterns in the signals), and provide some output, such as control the energy of future pulses or warn the operator if the received energy is not within a desired range. Although pulses 750 do not anneal substrate 100, the acoustic response will have detectable features that indicate the exact character of energy pulses required for annealing. As discussed above, a substrate with more crystal disorder, or a disordered region of greater depth, will absorb and dissipate more incident energy, and a substrate with more crystal order will transmit more incident energy, yielding a different acoustic response. Analysis can reveal an optimal intensity and number of pulses 756 (FIG. 7D) to be delivered in step 708 to achieve the desired results. Delivery of the second group of pulses may be monitored, 710, and may optionally be accompanied by endpoint detection 712. After the endpoint is reached in FIGS. 6A and 7A, region 113 will be optimally annealed, and implantation layer 650 will have disappeared as dopants will have been incorporated into the crystal lattice.

Flash Lamp Apparatus

FIG. 8A illustrates an apparatus according to one embodiment of the invention. A body portion 800 is provided having an octagonal outer wall 802. A first end 810 of body portion 800 is coupled to substrate holder 804. Substrate holder 804 may be fitted with a hinged lid configured to allow loading and unloading of substrates, or with a side opening for exchanging substrates, neither of which is shown in FIG. 8A or 8B. Substrates may be held in place using substrate holder 804, which may operate by electrostatic means, vacuum means, clamps, Bernoulli chucking, air flotation, pin support, or acoustic means, none of which are shown. Referring to FIG. 8B, a reflective liner 806 may be disposed on an inner surface of outer wall 802 of body portion 800. Substrate holder 804 is preferably configured to hold substrate 808 in a position of substantial radial alignment with body portion 800, in order to promote maximum uniform irradiation of substrate 808. Substrate holder 804 may be configured to hold substrate 808 in any orientation or condition, including substantially planar orientations or deformed orientations, such as convex or concave curvature. Substrate holder 804 may also be configured to deliver thermal energy to the substrate 808 during processing in order to control bulk temperature of substrate 808. Such thermal energy may be delivered by heating or cooling the surface of the substrate holder 804 contacting the backside of the substrate. The heating or cooling may be accomplished according to means well known to the art, such as circulating heating or cooling fluids through the substrate holder. Background or bulk thermal energy may also be delivered by any convenient non-contact means, such as heat lamps, cooling gases, and the like. For example, substrate 808 may be held in place through electrostatic forces or air pressure or vacuum, with cooling gas providing a cushion for substrate 808, such that there is no contact between substrate 808 and substrate holder 804. Substrate 808, individually or in combination with substrate holder 804, may be subjected to rotational energy, such as through magnetic coupling or mechanical rotation.

Referring again to FIG. 8A, a radiation assembly 812 is coupled to a second end 814 of body portion 800. Radiation assembly 812 is configured to house a plurality of flash lamps in a manner to direct electromagnetic energy from the flash lamps into body portion 800, which in turn directs the energy onto substrate 808. Referring to FIG. 8C, radiation assembly 812 is illustrated in side-view, showing the plurality of flash lamps 816 housed in trough reflectors 818. Trough reflectors 818 are arranged along a rear surface 820 of radiation assembly 812. Rear surface 820 is configured to approximate an arc of a circle centered at a point 822 where lines extended from side walls 824 of radiation assembly 812 would meet. Radiation assembly 812 may have a reflective liner 826 covering the side walls 824, rear surface 820, and trough reflectors 818. Radiation assembly 812 may also have a lens 828 disposed in a lens opening 830 to direct electromagnetic energy from radiation assembly 812 through body portion 800 onto substrate 808. Lens 828 may be simple or compound, with planar, convex, or concave surfaces. Lens 828 may also be a Fresnel lens, and may be reticulated, stipled, or faceted. Lens 828 occupies the junction between lens opening 830 of radiation assembly 812 and second end 814 of body portion 800. Radiation assembly 812 may be a flash box.

Figure 8F:
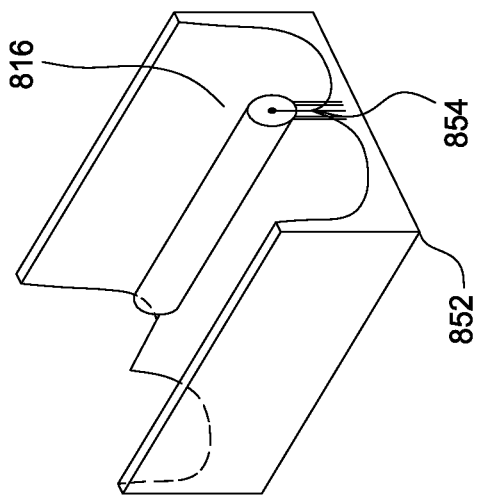
Figure 8E:
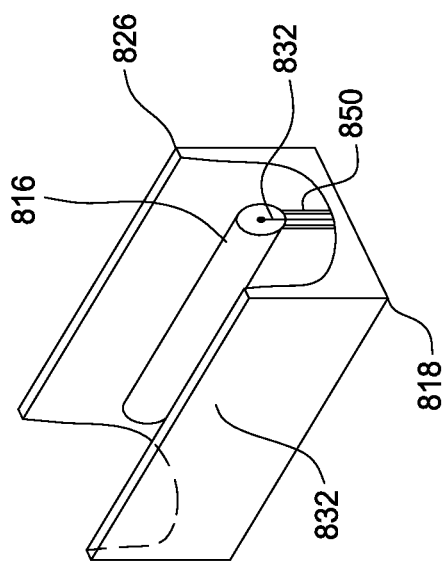

FIG. 8D illustrates radiation assembly 812 viewed through lens opening 830 (FIG. 8C). Flash lamps 816 and trough reflectors 818 can be seen on the rear surface 820 of radiation assembly 812. This perspective view also illustrates the circular arc shape of rear surface 820. FIG. 8E is an isometric view of one trough reflector and flash lamp assembly according to one embodiment of the invention. Flash lamps 816 may be cylindrical in shape, and may be disposed within trough reflectors 818. Trough reflectors 818 may be parabolic in cross-section to minimize energy loss through scattering. Flash lamps 816 are powered by electrodes 832, and are spaced apart from trough reflectors by supports 850. Each flash lamp may be powered by a separate power supply, or banks of flash lamps may be grouped and powered by single power supplies. Reflective liner 826 facilitates reflection of light emitted into trough reflector 818 back into radiation assembly 812 toward lens 828. FIG. 8F is an isometric view of a trough reflector 852 according to another embodiment of the invention. The trough reflector 852 features generally the same components as the trough reflectors 818 of FIG. 8E, with the exception of a ridge 854 down the center of the trough. The ridge serves to send light emanating from the flash lamp 816 reflecting away from the lamp, so that any reflected light does not travel back through the lamp 816. In one embodiment, the ridge 854 forms an involute, resulting in a trough reflector 852 with an involuted parabolic profile. In other embodiments, the trough 852 may have an involuted irregular profile configured to direct reflected light in specific ways.

Referring again to FIG. 8C, a power system is shown coupled to radiation assembly 812 for powering flash lamps 816. A capacitor 834 is shown coupled to a charging circuit 836 and a firing circuit 838. The capacitor can thus be charged and discharged using the switches 840. A power supply 842 is shown for charging the capacitor 834, and a controller 844 is shown for operating the switches. Switches 840 may be operated by controller 844 to charge and discharge capacitor 834. Flash lamps 816 are energized by firing leads 848. Because the differing lengths of firing leads 848 may result in non-uniform power delivery to flash lamps 816 and non-optimum flash timing, it may be advantageous to discharge capacitor 834 through power distributor 846. Power distributor 846 equalizes power delivered to flash lamps 816 through firing leads 848, if desired. For simplicity, a single set of charging and firing circuits is illustrated, although, as discussed above, multiple such circuits may be used to discharge one or more flash lamps 816. Using more circuits facilitates optimization of the firing pattern for the flash lamps 816, and prolongs the useful life of flash lamps by allowing operation of the apparatus without firing every lamp every time. Likewise, multiple capacitors may be used in parallel to allow charging and discharge of larger electric charges, and multiple circuits may additionally be employed to generate pulse trains using flash lamps. Finally, inductors (not shown) may also be selectively included in the firing circuit to tune the shape of the power pulse discharged through the flash lamps 816. Circuits (not shown) for pre-ionizing the flash lamps at low current may be used to synchronize the output of the flash lamps in the radiation assembly.

In one embodiment, a plurality of flash lamps is disposed in a radiation assembly such as radiation assembly 812. In some embodiments, the plurality of flash lamps comprises two banks of flash lamps, each bank configured similar to the embodiment shown in FIG. 8D. In one embodiment, the plurality of flash lamps comprises two banks of flash lamps, wherein each bank of flash lamps comprises 18 flash lamps. In some embodiments, the plurality of flash lamps may be arranged in banks with a staggered configuration, such that a line drawn from one lamp to the lens 828 of FIG. 8C does not impinge another lamp. In other embodiments, the flash lamps may comprise a close-packed planar linear array. The flash lamps may be disposed in parabolic reflector troughs, involuted parabolic reflector troughs, involuted irregular reflector troughs, or any combination thereof. In other embodiments, more than two banks of flash lamps may be used.

Figures 9A, 9B:
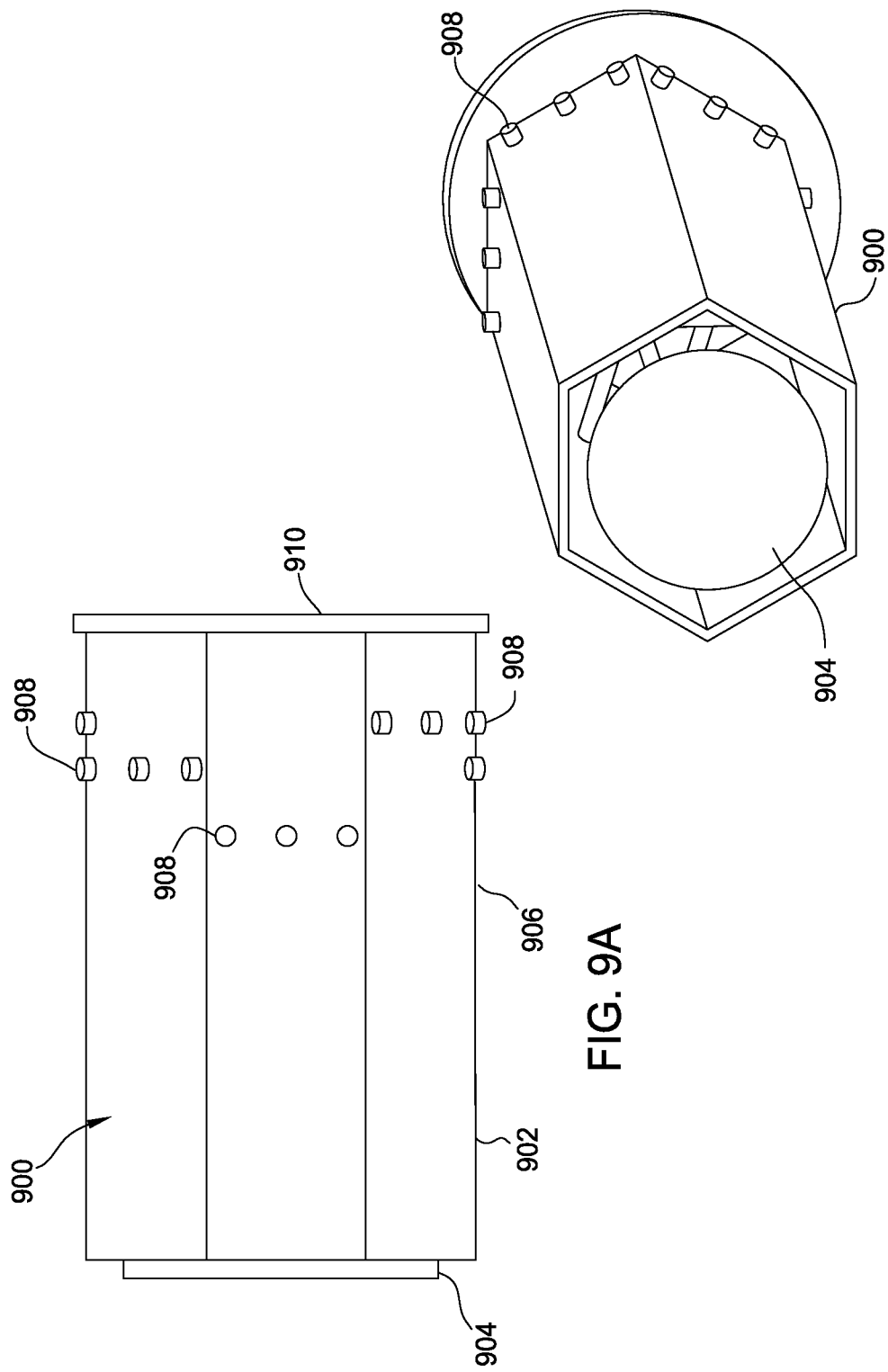
FIGS. 9A-9B are diagrams of another apparatus according to an embodiment of the invention.

FIG. 9A illustrates an alternative embodiment of a flash lamp apparatus 900. A body portion 902 is provided with a substrate holder 904 at one end and a radiance region at the other end. Radiance region 906 features flash lamps 908 disposed across the internal area of body portion 902. Each flash lamp 908 is configured to pierce at least one side (e.g., two are shown) of body portion 902. Body portion 902 may be hexagonal in cross-section, octagonal, square, or any advantageous shape. Flash lamps may be disposed one for each pair of sides of body portion 902, or more than one flash lamp may be disposed for each pair of sides. Flash lamps 908 may be longitudinally spaced along the length of body portion 902 to avoid spacing conflicts within the body portion. Alternately, flash lamps 908 may be configured to span only a portion of radiance region 906 so as to avoid spacing conflicts. Backing plate 910 and substrate holder 904 are sealably coupled to body portion 902 to prevent intrusion of atmospheric gases that may provoke arcing or unwanted reactions with substrate or apparatus materials when exposed to energy from flash lamps 908. Similar power circuits and substrate holders may be provided with this alternative embodiment as illustrated in FIGS. 8A-8F. FIG. 9B shows a perspective drawing of apparatus 900. The sealing portion of substrate holder 904 is removed to illustrate the internal arrangement of flash lamps 908. As with the embodiment discussed above, the inside surface of body portion 902, backing plate 910, and exposed surfaces of substrate holder 904 are lined with a reflective material. It should be noted that any arrangement of flash lamps 908 may be used to deliver energy to body portion 902.

Flash lamp apparatuses illustrated in FIGS. 8A-9B may be constructed of any advantageous material that can be fitted with a reflective liner. For example, the outer surfaces of body portions 800 and 902, and the outer surfaces of radiation assembly 812 (including trough reflectors 818) and backing plate 910 may be constructed of metal, such as nickel. The reflective lining disposed on the internal surfaces of those elements may be a reflective metal, such as silver, or a reflective polymer, such as a chlorofluorocarbon polymer or similar material. The walls may be fluid cooled, with forced flow or natural convection, and with or without cooling fins. Furthermore, the flash lamps may also be fluid cooled by forced flow through an annular region between a jacket and the flash lamp. Flash lamp tubes may be doped to remove unwanted portions of the spectrum radiated by the lamps. For example, tubes may be doped with cerium ions, such as $Ce^{3+}$ or $Ce^{4+}$ to remove UV components from the emitted radiation.

In operation, it may be advantageous to control the composition of space through which the electromagnetic energy travels. High vacuum is advantageous, but may be difficult to maintain, and may result in leakage of atmospheric gases into the apparatus. In embodiments featuring a silver internal lining, trace amounts of sulphur compounds in atmospheric gases would degrade the reflective silver lining. Alternately, the apparatus may be filled with a non-reactive gas, such as nitrogen or argon. Such gas must be selected to avoid absorbing energy from the light source as much as possible. Additionally, the gas should not react with materials on the substrate, and it should not ionize readily, to minimize the possibility of arcing inside the apparatus. In embodiments featuring gas delivery to the apparatus, a gas delivery system is provided, although not shown in the figures.

In some embodiments, it may be advantageous to deliver different wavelengths of light to motivate more or less massive atoms in a crystal lattice. Electromagnetic pulses from the two lasers may be interwoven in any pattern which may be advantageous for accomplishing particular adjustments to a substrate lattice. For example, pulses may be alternated, or alternated in groups. Pulses from the two different lasers may also be applied simultaneously to different zones of the substrate. Lasers may also be combined with flash lamps in any advantageous arrangement. Wavelengths of radiation from microwave, through infrared and visible, into UV may be used.

In some embodiments, it may be advantageous to deliver electromagnetic radiation using multiple banks of sources. In one embodiment, two banks of flash lamps may be used. The multiple banks of sources may be energized at the same time to generate a single pulse from all sources at once, or they may be energized in any advantageous pattern. For example, an embodiment featuring two sources, or two banks of sources, may comprise energizing the two sources, or the two banks of sources, in an alternating pattern. Such a configuration may simplify charging and discharging of power delivery circuits.

EXAMPLES

PTA treatment of a 200 Angstrom junction layer would be expected to yield useful results. After implanting with a dose of $10^{15}$ dopant atoms at an energy of 250 eV, 1000 pulses of 532 nm laser light may be delivered in a train of pulses. With each pulse delivering an energy density of 0.3 $J/cm^2$, duration of about 1 msec, and separated by a rest duration of 30 msec, sheet resistivity of the junction after annealing is expected to be less than about 400 $\Omega/cm^2$. The same instance with implant energy of 500 eV is expected to achieve sheet resistivity after annealing generally less than 200 $\Omega/cm^2$.

For example, after implanting with a dose of $2\times10^{15}$ boron atoms from an octadecaborane precursor at an energy of 250 eV, PTA treatment was performed with 30 20-nsec. pulses of 532 nm laser light delivered to a substrate at 5 pulses per second, each pulse carrying approximately 150 millijoules (mJ) of energy at a density of 0.234 $J/cm^2$, resulting in resistivity of 537 $\Omega/cm^2$ following PTA treatment. After 1,000 pulses, resistivity dropped to 428 $\Omega/cm^2$, and after 38,100 pulses, 401 $\Omega/cm^2$. A similar anneal process using pulses that each delivered approximately 165 mJ of energy at a density of 0.258 $J/cm^2$ achieved resistivity of 461 $\Omega/cm^2$ after 30 pulses, 391 $\Omega/cm^2$ after 1,000 pulses, and 333 $\Omega/cm^2$ after 100,000 pulses.

While the foregoing is directed to embodiments of the present invention, other and further embodiments of the invention may be devised without departing from the basic scope thereof, and the scope thereof is determined by the claims that follow.

The invention claimed is:

1. An apparatus for treating a substrate, comprising:
a first laser source comprising a switch optically coupled to a laser radiation source;
a substrate support movably disposed along an optical path of the laser radiation;
a capacitor and a power supply, wherein the power supply is configured to charge the capacitor;
a controller coupled to the substrate support, the power supply, and to the switch to form pulses of electromagnetic radiation; wherein the controller is configured to operate the switch to generate pulses of laser radiation with an interval between pulses of between 1 msec and 20 msec; wherein the controller is configured to operate the switch to generate a pulse train with an interval between pulses that dissipates the energy of one pulse within a substrate before the next pulse impacts the substrate; wherein the controller is configured to operate the switch to generate a pulse train of laser radiation; wherein the switch is an optical switch, a Pockels cell, or a fast shutter;
an optical assembly disposed along the optical path of the laser radiation between the laser radiation source and the substrate support; wherein the optical assembly is positioned to receive the pulses of electromagnetic radiation and direct a pulse train of temporally shaped identical pulses of electromagnetic radiation, wherein the duration of each pulse is between about 1 nsec to about 10 msec, wherein each pulse is configured to micro-anneal; and
a detector comprising a laser configured to deliver low-energy electromagnetic radiation and disposed to direct electromagnetic energy toward the substrate support, and a photoacoustic detector disposed to receive reflected electromagnetic energy.

2. The apparatus of claim 1, wherein the switch is an electrical switch.

3. The apparatus of claim 1, wherein the optical assembly combines the received pulses of electromagnetic radiation to form the temporally shaped pulses of electromagnetic radiation.

4. The apparatus of claim 1, further comprising a substrate having a plurality of dies configured to form anneal regions upon annealing, wherein the boundary of each anneal regions has a boundary defined by kerf lines, wherein each of the anneal regions is a rectangular region having a size of about 22 mm by about 33 mm.

5. The apparatus of claim 4, further comprising a second laser source disposed on an opposite side of the substrate from the first laser source.

\* \* \* \* \*